US008298886B2

(12) United States Patent
Loechelt et al.

(10) Patent No.: US 8,298,886 B2
(45) Date of Patent: Oct. 30, 2012

(54) ELECTRONIC DEVICE INCLUDING DOPED REGIONS BETWEEN CHANNEL AND DRAIN REGIONS AND A PROCESS OF FORMING THE SAME

(75) Inventors: Gary H. Loechelt, Tempe, AZ (US); Gordon M. Grivna, Tempe, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 236 days.

(21) Appl. No.: 12/702,025

(22) Filed: Feb. 8, 2010

(65) Prior Publication Data

US 2011/0193143 A1  Aug. 11, 2011

(51) Int. Cl.
*H01L 21/337* (2006.01)
(52) U.S. Cl. ........ 438/194; 438/286; 438/305; 438/306; 257/315; 257/336; 257/345; 257/369; 257/E21.427
(58) Field of Classification Search .................. None
See application file for complete search history.

(56) References Cited

U.S. PATENT DOCUMENTS

| | | | |
|---|---|---|---|
| 4,633,289 A | 12/1986 | Yuan-Tai Chen | |
| 4,710,477 A | 12/1987 | Chen | |
| 5,275,961 A * | 1/1994 | Smayling et al. | 438/286 |
| 5,559,044 A | 9/1996 | Williams et al. | |
| 5,939,755 A | 8/1999 | Takeuchi et al. | |
| 6,258,680 B1 * | 7/2001 | Fulford et al. | 438/305 |
| 6,518,138 B2 | 2/2003 | Hsing | |
| 6,764,940 B1 | 7/2004 | Rozbicki et al. | |
| 6,890,804 B1 | 5/2005 | Shibib et al. | |
| 6,949,432 B2 | 9/2005 | Blanchard | |
| 7,256,119 B2 | 8/2007 | Grivna et al. | |
| 7,276,747 B2 | 10/2007 | Loechelt et al. | |
| 7,391,080 B2 | 6/2008 | Amborg et al. | |
| 7,439,583 B2 | 10/2008 | Hshieh | |
| 7,446,375 B2 | 11/2008 | Xu et al. | |
| 2002/0025642 A1 * | 2/2002 | Akram et al. | 438/305 |
| 2004/0099878 A1 | 5/2004 | Huang et al. | |
| 2004/0232476 A1 * | 11/2004 | Kang et al. | 257/315 |
| 2005/0118770 A1 * | 6/2005 | Nandakumar et al. | 438/305 |
| 2007/0278516 A1 | 12/2007 | Hashimoto et al. | |
| 2008/0122025 A1 | 5/2008 | Roggenbauer et al. | |
| 2008/0197411 A1 | 8/2008 | Korec et al. | |

(Continued)

FOREIGN PATENT DOCUMENTS

WO 2007/118060 A2 10/2007

OTHER PUBLICATIONS

T. Hasiomoto et al., "System with Mounted Capacitor for Reduced Parasitic Inductance in Voltage Regulators", 2008, IEEE.

(Continued)

*Primary Examiner* — Kyoung Lee

(57) ABSTRACT

An electronic device can include a drain region of a transistor, wherein the drain region has a first conductivity type. The electronic device can also include a channel region of the transistor, wherein the channel region has a second conductivity type opposite the first conductivity type. The electronic device can further include a first doped region having the first conductivity type, wherein the first doped region extends from the drain region towards the channel region. The electronic device can still further include a second doped region having the first conductivity type, wherein the second doped region is disposed between the first doped region and the channel region.

24 Claims, 12 Drawing Sheets

U.S. PATENT DOCUMENTS

2008/0242029 A1 10/2008 Wu et al.
2008/0246086 A1 10/2008 Korec et al.

OTHER PUBLICATIONS

Adriaan W. Ludikhuize "Self-aligned and Shielded-Resurf LDMOS for Dense 20V Power IC's", The 11th International Symposium on Power Semiconductor Devices and IC's, (ISPSD99), Toronto, Canada, May 26-28, 1999.

Wayne Burger et al., "RF-LDMOS: A Device Technology for High Power RF Infrastructure Applications", IEEE CSIC Digest, 2004.

Peter Hazucha et al., "A 233-MHz 80%-87% Efficient Four-Phase DC-DC Converter Utilizing Air-Core Inductors on Package", IEEE Journal of Solid State Circuits, vol. 40, No. 4, Apr. 2005.

Gary H. Loechelt, U.S. Appl. No. 12/337,234, filed Dec. 17, 2008.

Gary H. Loechelt, U.S. Appl. No. 12/337,271, filed Dec. 17, 2008.

Gary H. Loechelt, U.S. Appl. No. 12/337,306, filed Dec. 17, 2008.

Gerhard Schrom et al., "A 480-MHz, Multi-Phase Interleaved Buck DC-DC Converter with Hysteretic Control", Circuit Research, Intel Labs, Hillsboro, OR, USA, IEEE, 2040.

Robert D. Rung et al., "A Retrograde p-Well for Higher Density CMOS", IEEE Transactions on Electron Devices, vol. ED-28, No. 10, pp. 1115-1119 (1981).

Fatemi, Homi (instructor); Ion Implantation; Electrical Engineering and Computer Sciences X 405, Semiconductor Fabrication Technology (course), University of California, Berkley Extension; 4 pages (1985).

Gary H. Loechelt, U.S. Appl. No. 12/495,250, filed Jun. 30, 2009.

Gary H. Loechelt, U.S. Appl. No. 12/495,278, filed Jun. 30, 2009.

\* cited by examiner

ELECTRONIC DEVICE INCLUDING DOPED REGIONS BETWEEN CHANNEL AND DRAIN REGIONS AND A PROCESS OF FORMING THE SAME

FIELD OF THE DISCLOSURE

The present disclosure relates to electronic devices and processes of forming electronic devices, and more particularly to, electronic devices including doped regions between channel and drain regions and processes of forming the same.

RELATED ART

Metal-oxide semiconductor field effect transistors (MOSFETs) are a common type of power switching device. A MOSFET includes a source region, a drain region, a channel region extending between the source and drain regions, and a gate structure provided adjacent to the channel region. The gate structure includes a gate electrode layer disposed adjacent to and separated from the channel region by a thin dielectric layer.

When a MOSFET is in the on state, a voltage is applied to the gate structure to form a conduction channel region between the source and drain regions, which allows current to flow through the device. In the off state, any voltage applied to the gate structure is sufficiently low so that no significant current flows through the channel of the transistor. During the off state, the device should support a high voltage between the source and drain regions.

In a particular application, a pair of power transistors can be used to allow an output to switch between two different voltages. The output can be connected to a source of a high-side power transistor and to a drain of a low-side power transistor. When the high-side power transistor is activated, the output will be at a voltage corresponding to the voltage on a drain of the high-side power transistor, and when the low-side power transistor is activated, the output will be at a voltage corresponding to a source of the low-side power transistor. In a particular physical embodiment, the high-side power transistor and the low-side power transistor are typically discrete transistors on separate dies that are interconnected to each other by bonded wire or other similar interconnects. The interconnects increase the parasitic characteristics of the electronic device, including the high-side and low-side power transistors, which are undesired.

BRIEF DESCRIPTION OF THE DRAWINGS

Embodiments are illustrated by way of example and are not limited in the accompanying figures.

Figure 1:
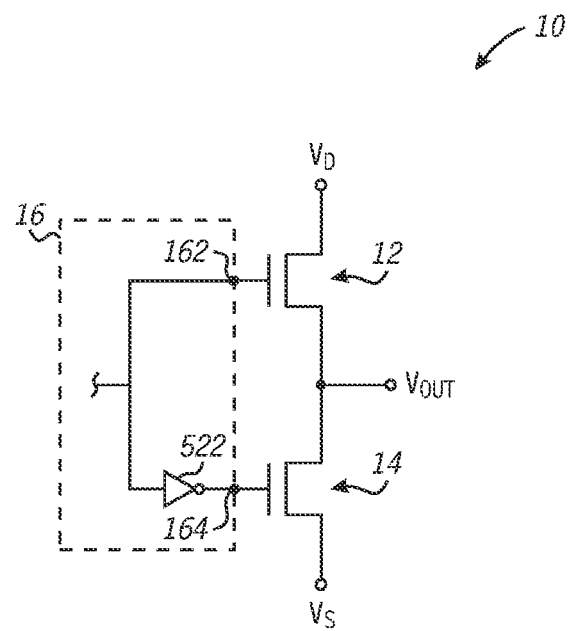
FIG. 1 includes a circuit diagram of a portion of an electronic device.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

As used herein, the terms "horizontally-oriented" and "vertically-oriented," with respect to a region or structure, refer to the principal direction in which current flows through such region or structure. More specifically, current can flow through a region or structure in a vertical direction, a horizontal direction, or a combination of vertical and horizontal directions. If current flows through a region or structure in a vertical direction or in a combination of directions, wherein the vertical component is greater than the horizontal component, such a region or structure will be referred to as vertically oriented. Similarly, if current flows through a region or structure in a horizontal direction or in a combination of directions, wherein the horizontal component is greater than the vertical component, such a region or structure will be referred to as horizontally oriented.

The term "metal" or any of its variants is intended to refer to a material that includes an element that is within any of the Groups 1 to 12, within Groups 13 to 16, an element that is along and below a line defined by atomic numbers 13 (Al), 31 (Ga), 50 (Sn), 51 (Sb), and 84 (Po). Metal does not include Si or Ge.

The term "normal operation" and "normal operating state" refer to conditions under which an electronic component or device is designed to operate. The conditions may be obtained from a data sheet or other information regarding voltages, currents, capacitance, resistance, or other electrical parameters. Thus, normal operation does not include operating an electrical component or device well beyond its design limits.

The term "power transistor" is intended to mean a transistor that is designed to normally operate at least a 10 V difference to be maintained between the source and drain or emitter and collector of the transistor. For example, when the transistor is in an off-state, a 10 V may be maintained between the source and drain without a junction breakdown or other undesired condition occurring.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

FIG. 1 includes a circuit diagram of a portion of an electronic device 10. In the embodiment as illustrated in FIG. 1, the electronic device 10 can include a power switching circuit. The electronic device 10 includes a transistor 12, wherein a drain region of the transistor 12 is coupled to a terminal, such as $V_D$, and a source region of the transistor 12 is coupled to a terminal, such as $V_{OUT}$. The electronic device 10 also includes a transistor 14, wherein a drain region of the transistor 12 is coupled to the source of the transistor 12, and a source region of the transistor 14 is coupled to a terminal, such as $V_S$. The gate electrodes of the transistors 12 and 14 can be coupled to control terminals 162 and 164 of a control unit 16. In a particular embodiment, the control unit 16 can be configured such that only one of the transistors 12 and 14 is enabled at any particular point in time. When the transistor 12 is enabled (and the transistor 14 is disabled), $V_{OUT}$ will be substantially $V_D$, and when the transistor 14 is enabled (and the transistor 12 is disabled), $V_{OUT}$ will be substantially $V_S$. The control unit 16 can be used to determine when and how frequently $V_{OUT}$ will be switched from $V_S$ to $V_D$, and vice versa. In a more particular embodiment, the transistors 12 and 14 can be power switching transistors within a high-frequency voltage regulator.

Physical structures corresponding to the transistors 12 and 14 and processes of forming such physical structures are described below. In the description below, the transistor 12 may be referred to as the high-side power transistor, and the transistor 14 may be referred to as the low-side power transistor. Much of the description will focus on the formation of the physical structure for the high-side power transistor; however, the formation of the low-side power transistor is similar. In an embodiment, the transistors 12 and 14 will be part of the same integrated circuit. In a particular embodiment, the control unit 16 is on the same integrated circuit as the transistors 12 and 14.

Figure 2:
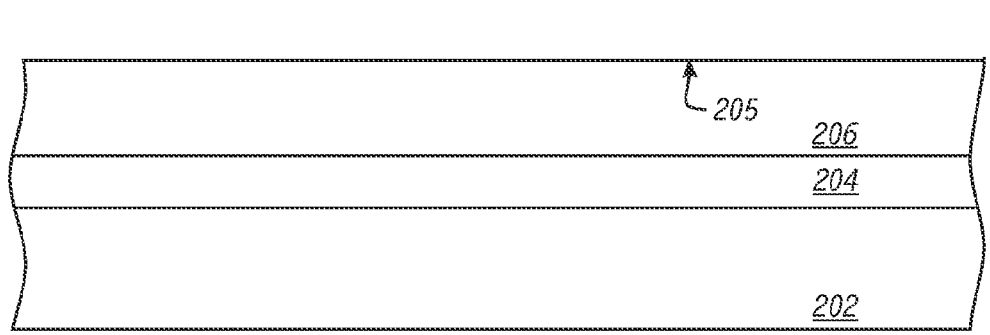
FIG. 2 includes an illustration of a cross-sectional view of a portion of a workpiece including a buried conductive region, a buried insulating layer, and a semiconductor layer.

FIG. 2 includes an illustration of a cross-sectional view of a portion of a workpiece 200 that includes a buried conductive region 202, a buried insulating layer 204, and a semiconductor layer 206. The buried conductive region 202 can include a Group 14 element (i.e., carbon, silicon, germanium, or any combination thereof) and can be heavily n-type or p-type doped. For the purposes of this specification, heavily doped is intended to mean a peak dopant concentration of at least approximately $1 \times 10^{19}$ atoms/cm$^3$, and lightly doped is intended to mean a peak dopant concentration of less than approximately $1 \times 10^{19}$ atoms/cm$^3$. The buried conductive region 202 can be a portion of a heavily doped substrate (e.g., a heavily n-type doped wafer) or may be a buried doped region disposed over a substrate of opposite conductivity type or over another buried insulating layer (not illustrated) that is disposed between a substrate and the buried conductive region 202. In an embodiment, the buried conductive region 202 is heavily doped with an n-type dopant, such as phosphorus, arsenic, antimony, or any combination thereof. In a particular embodiment, the buried conductive region 202 includes arsenic or antimony if diffusion of the buried conductive region 202 is to be kept low, and in a particular embodiment, the buried conductive region 202 includes antimony to reduce the level of autodoping (as compared to arsenic) during formation of a subsequently-formed semiconductor layer. The buried conductive region 202 will be used to electrically connect the source of the high-side power transistor and the drain of the low-side power transistor together and be part of an output node for the electronic device.

The buried insulating layer 204 is disposed over the buried conductive region 202. During normal operation, the buried insulating layer 204 helps to isolate the voltage on the buried conductive region 202 from portions of the semiconductor layer 206. The buried insulating layer 204 can include an oxide, a nitride, or an oxynitride. The buried insulating layer 204 can include a single film or a plurality of films having the same or different compositions. The buried insulating layer 204 can have a thickness in a range of at least approximately 0.2 micron or at least approximately 0.3 micron. Further, the buried insulating layer may have a thickness no greater than approximately 5.0 microns or no greater than approximately 2.0 microns. In a particular embodiment, the buried insulating layer 204 has a thickness in a range of approximately 0.5 micron to approximately 0.9 micron.

The semiconductor layer 206 is disposed over the buried insulating layer 204 and has a primary surface 205 where the transistors and other electronic components (not illustrated) are formed. The semiconductor layer 206 can include a Group 14 element (i.e., carbon, silicon, germanium, or any combination thereof) and any of the dopants as described with respect to the buried conductive region 202 or dopants of the opposite conductivity type. In an embodiment, the semiconductor layer 206 is a lightly doped n-type or p-type epitaxial silicon layer having a thickness in a range of approximately 0.2 micron to approximately 5.0 microns, and a doping concentration no greater than approximately $1\times10^{17}$ atoms/cm$^3$, and in another embodiment, a doping concentration of at least approximately $1\times10^{14}$ atoms/cm$^3$. The semiconductor layer 206 may be disposed over all of the workpiece 200. The dopant concentration within the semiconductor layer 206 as formed or before selectively doping regions within the semiconductor layer 206 will be referred to as the background dopant concentration.

The workpiece 200 can be formed using a variety of fabrication techniques. In an embodiment, a wafer-bonding technique can be used. For example, the buried conductive region 202 and the semiconductor layer 206 may be portions of different substrates that are bonded together. An oxide may be thermally grown from one or both substrates. In a particular embodiment, the buried conductive region 202 may include lower doping near the surface from which the oxide is grown. The doping concentration within the buried conductive region 202 may be slightly higher due to dopant pile-up at the interface with the oxide. Thus, the buried conductive region 202 can be heavily doped except for a portion near the oxide interface, and such portion may have a lowest dopant concentration spaced apart from the oxide layer. After bonding, most of one of the substrates can be removed to leave the semiconductor layer 206. The oxide layer that was thermally grown from one or both of the substrates can form at least part of the buried insulating layer 204. In another embodiment, the buried conductive region 202 can be in the form of a heavily doped wafer. The semiconductor layer 206 can be epitaxial grown from the buried conductive region 202. An oxygen implantation and an anneal can be performed to form the buried insulating layer 204 from portions of the buried conductive region 202, the semiconductor layer 206, or both. After reading this specification, skilled artisans will appreciate that the workpiece 200 can be formed using other techniques.

Figure 3:
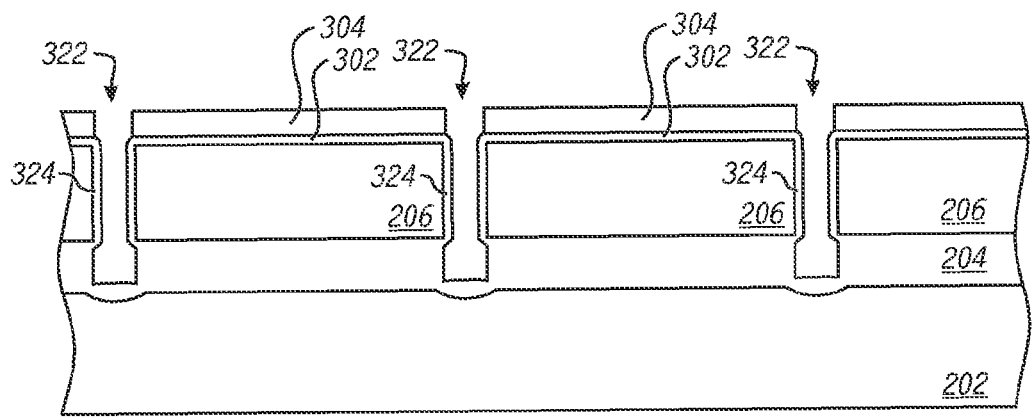
FIG. 3 includes an illustration of a cross-sectional view of the workpiece of FIG. 2 after forming a pad layer, a stopping layer, and etching a trench into the workpiece.

Referring to FIG. 3, a pad layer 302 and a stopping layer 304 (e.g., a polish-stop layer or an etch-stop layer) are sequentially formed over the semiconductor layer 206 using a thermal growth technique, a deposition technique, or a combination thereof. Each of the pad layer 302 and the stopping layer 304 can include an oxide, a nitride, an oxynitride, or any combination thereof. In an embodiment, the pad layer 302 has a different composition as compared to the stopping layer 304. In a particular embodiment, the pad layer 302 includes an oxide, and the stopping layer 304 includes a nitride.

A patterned masking layer (not illustrated) is formed over the stopping layer 304. Trenches 322 within the semiconductor layer 206 and the buried insulating layer 204 are formed where vertical conductive structures will be formed. In a particular embodiment, exposed portions of the pad layer 302, stopping layer 304, the semiconductor 206, and the buried insulating layer 204 are removed. Anisotropic etching techniques are used to form the structures as illustrated in the embodiment of FIG. 3. In another embodiment, substantially none of the buried insulating layer 204 is removed, and in another embodiment, only part or substantially all of the thickness of the buried insulating layer 204 disposed under the openings is removed. In a particular embodiment, the width of each of the trenches 322 is at least approximately 0.05 micron or approximately 0.1 micron, and in another particular embodiment, the width of each of the trenches 322 is no greater than approximately 2 microns or approximately 1 micron. The patterned masking layer can be removed after forming the trenches 322.

Insulating spacers 324 can be formed within the trenches 322. The insulating spacers 324, which can also be referred to as insulating liners, can help to electrically insulate the semiconductor layer 206 from vertical conductive structures that will be subsequently formed within the trenches 322. In the embodiment as illustrated, a thermal oxidation can be performed to form the insulating spacer 324. In another embodiment (not illustrated), an insulating layer can be conformally deposited and anisotropically etched to form the insulating spacers. The insulating spacers 324 have a width in a range of approximately 20 nm to approximately 200 nm.

Figure 4:
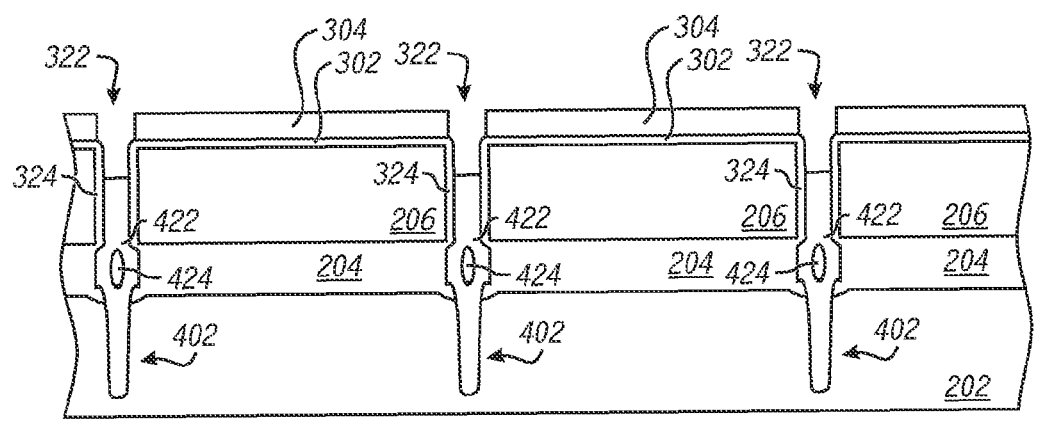
FIG. 4 includes an illustration of a cross-sectional view of the workpiece of FIG. 3 after forming vertical conductive structures within the trenches.

FIG. 4 includes an illustration after extending the trenches and forming vertical conductive structures 422. Any remaining insulating material, such as oxide, along the bottoms of the trenches 322 (as illustrated in FIG. 3) can be removed, and the trenches 322 can be extended into the buried conductive region 202 to form the trench extensions 402. In an embodiment, the trench extensions 402 may be at least approximately 0.2 micron into the buried conductive region 202, and in another embodiment, the trench extensions 402 may be at least approximately 0.3 micron. In a further embodiment, the trench extensions 402 may be no greater than approximately 5.0 micron, and in still a further embodiment no greater than approximately 2.0 microns. In another embodiment, the trench extensions may be deeper or shallower than described above. The removal of the insulating material and forming the trench extensions 402 can be performed using an anisotropic etch technique.

A conductive layer is formed over the stopping layer 304 and within the trenches 322, and, in a particular embodiment, the conductive layer substantially fills the trenches 322. The conductive layer can be polycrystalline and include a metal-containing or semiconductor-containing material. In an embodiment, the conductive layer can include a heavily doped semiconductor material, such as amorphous silicon or polysilicon. In another embodiment, the conductive layer includes a plurality of films, such as an adhesion film, a barrier film, and a conductive fill material. In a particular embodiment, the adhesion film can include a refractory metal, such as titanium, tantalum, tungsten, or the like; the barrier film can include a refractory metal nitride, such as titanium nitride, tantalum nitride, tungsten nitride, or the like, or a refractory metal-semiconductor-nitride, such as TaSiN; and the conductive fill material can include tungsten or tungsten silicide. In a more particular embodiment, the conductive layer can include Ti/TiN/WSi. The selection of the number of films and composition(s) of those film(s) depends on electrical performance, the temperature of a subsequent heat cycle, another criterion, or any combination thereof. Refractory metals and refractory metal-containing compounds can withstand high temperatures (e.g., melting points of the refractory metals can be at least 1400° C.), may be conformally deposited, and have a lower bulk resistivity than heavily doped n-type silicon. After reading this specification, skilled artisans will be able to determine the composition of the conductive layer to meet their needs or desires for a particular application. During the formation of the conductive layer, voids 424 may form within the trenches 322. If voids 424 are formed, they are typically located near areas of the buried insulating layer 204. Thus, in the embodiment as illustrated in FIG. 4, substantially all of the voids 424 are disposed at elevations that are spaced apart from the elevation of the primary surface 205 of the semiconductor layer 206. In particular, substantially all of the voids 424 are disposed at elevations no higher than approximately halfway through the thickness of the semiconductor layer 206.

A portion of the conductive layer that is disposed over the stopping layer 304 is removed to form the vertical conductive structures 422 within the trenches 322, as illustrated in the embodiment of FIG. 4. The removal can be performed using a chemical-mechanical polishing or blanket etching technique. The stopping layer 304 may be used as a polish-stop or etch-stop layer. Polishing or etching may be continued for a relatively short time after the stopping layer 304 is reached to account for a non-uniformity across the workpiece with respect to the thickness of the conductive layer, non-uniformity of the polishing or etching operation, or any combination thereof. A continued etch or other removal operation can be used to recess the vertical conductive structures 422 further into the trenches 322, as illustrated by arrows 426 in FIG. 4, if needed or desired. The recessions may allow subsequently formed source regions for the high-side transistor structure and the drain regions of the low-side transistor structures to be electrically connected to the vertical conductive structures 422. When in the form of a finished electronic device, the combination of the vertical conductive structures 422 and buried conductive region 202 electrically connects the source of the high-side power transistor to the drain of the low-side power transistor.

Figure 5:
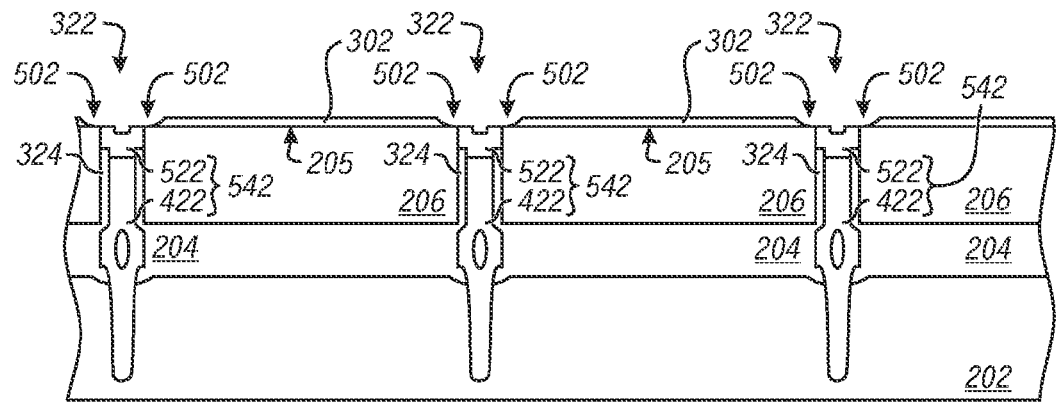
FIG. 5 includes an illustration of a cross-sectional view of the workpiece of FIG. 4 after forming conductive plugs over the vertical conductive structures FIGS. 6 and 7 include illustrations of cross-sectional views of the workpiece of FIG. 5 after forming an implant screen layer, horizontally-oriented doped regions, and drain regions within portions of the workpiece where the high-side and low-side power transistors are being formed.

Referring to FIG. 5, while portions of the stopping layer 304 are present (not illustrated in FIG. 5), the pad layer 302 is etched and undercuts part of the stopping layer 304 to expose portions of the semiconductor layer 206 near the trenches 322. At this point in the embodiment as illustrated on FIG. 4, an additional etch of the trench fill material may be performed exposing the upper surface of the trench liner material 324. The portions of the stopping layer 304 are then removed. Conductive plugs 522 are formed within the trenches and help to electrically connect the vertical conductive structures 422 to doped regions that will be subsequently formed within the semiconductor layer 206. The conductive plugs 522 can be formed using any of the materials and methods of formation for the vertical conductive structures 422, except that the conductive plugs 522 may or may not be recessed within the trenches 322. The conductive plugs 522 and vertical conductive structures 422 may include the same material or different materials and may be formed using the same technique or different techniques. The combinations of the conductive plugs 522 and the vertical conductive structures 422 can form vertically-oriented conductive regions 542. Hereinafter, vertically-oriented conductive regions 542 may refer to the vertical conductive structures 422, the conductive plugs 522, or combinations of the vertical conductive structures 422, and the conductive plugs 522. The pad layer 302 may be removed at this point in the process.

Figure 6:
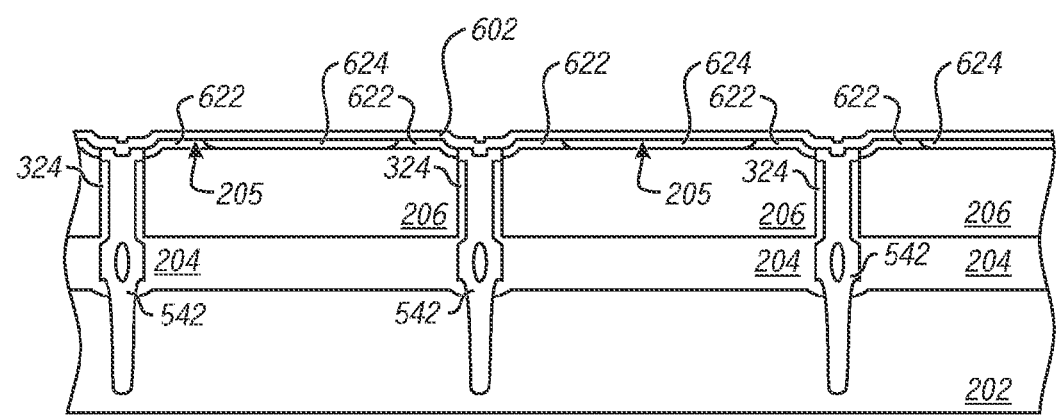
Figure 7:
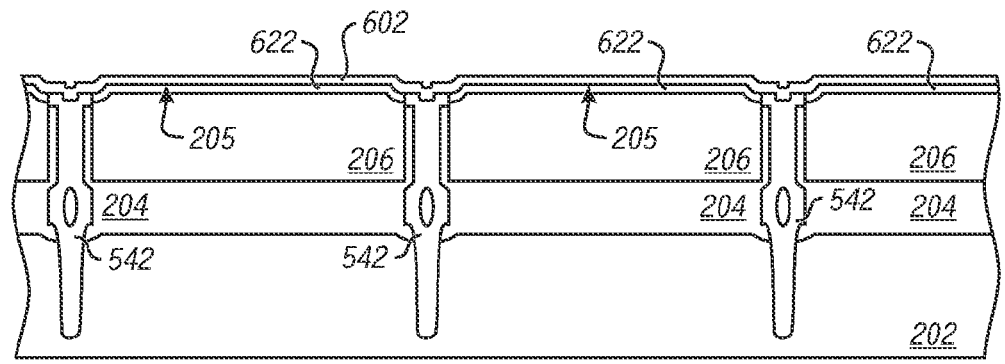

FIGS. 6 and 7 illustrate the workpiece after forming an implant screen layer 602, horizontally-oriented doped regions 622, and drain regions 624. FIG. 6 includes portions of transistor structures for the high-side power transistor 12, and FIG. 7 includes portions of transistor structures for the low-side power transistor 14. The implant screen layer 602 is formed over the primary surface 205 and can include an oxide, a nitride, or an oxynitride and may have a thickness in a range of approximately 2 nm to approximately 90 nm. The implant screen layer 602 can be formed by a thermal growth or deposition technique.

In the embodiment as illustrated in FIGS. 6 and 7, the horizontally-oriented doped regions 622 can be formed over substantially all of the area where the transistor structures for the high-side and low-side power transistors are formed. Within the power transistors, the horizontally-oriented doped regions 622 can be the main portions of the drift regions of the power transistors being formed. In a normal operating state, the charge carrier (for example, electrons) or current flows through the horizontally-oriented doped regions 622 principally in a horizontal direction. If the integrated circuit includes the control unit 16, a masking layer (not illustrated) may be formed to protect part or all of the semiconductor layer where electronic components of the control unit 16 are being formed. The horizontally-oriented doped regions 622 can have a dopant concentration of less than approximately $1\times10^{19}$ atoms/cm$^3$ and at least approximately $1\times10^{16}$ atoms/cm$^3$ and a depth in one embodiment of less than approximately 0.9 micron, and in another embodiment of less than approximately 0.5 micron.

A masking layer (not illustrated) can be formed and patterned to define openings over portions of the semiconductor layer 206 where the drain regions 624 are formed. In FIG. 6, the drain regions 624 for the high-side transistor 12 are formed within the semiconductor layer 206. The drain regions 624 include a relatively higher dopant concentration than the horizontally-oriented doped regions 622. The drain regions 624 can have a dopant concentration of at least approximately $1\times10^{19}$ atoms/cm$^3$ and a depth in one embodiment of less than approximately 0.9 micron, and in another embodiment of less than approximately 0.5 micron.

In FIG. 7, the drain regions for the low side transistor 14 can include the upper parts of the vertically-oriented conductive regions 542. In one embodiment, such upper parts can correspond to the conductive plug 522 in FIG. 5. Thus, the masking layer may completely cover the semiconductor layer 206 where transistors for the low-side power transistor 14 are being formed. In another embodiment (not illustrated), openings can be formed adjacent to the vertically-oriented conductive regions 542 as illustrated in FIG. 7, and portions of the semiconductor layer 206 under the openings can be doped to form drain regions similar to the drain regions 624.

In an embodiment, the horizontally-oriented doped regions 622 can be formed before the drain regions 624. In another embodiment, the horizontally-oriented doped regions 622 can be formed after the drain regions 624.

Figure 8:
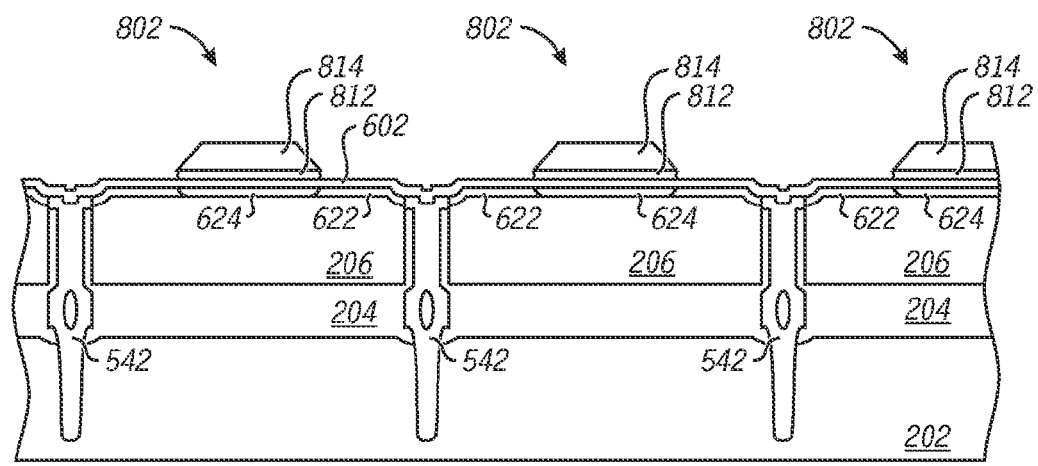
FIG. 8 includes an illustration of a cross-sectional view of the workpiece of FIGS. 6 and 7 after forming insulating members.

FIG. 8 includes an illustration after insulating members 802 are formed over the drain regions 624. Although not illustrated in FIG. 8, the insulating members 802 are also formed over the vertically-oriented conductive regions 542 for the low-side transistor 14 (FIG. 7), as the drain regions for the transistor structures of the low-side power transistor 14 are formed adjacent to the vertically-oriented conductive regions 542. The insulating members 802 can help reduce the capacitive coupling between the drain regions and subsequently-formed conductive electrodes and improve the breakdown voltage between the drain regions 624 and subsequently-formed conductive electrodes. The insulating members 802 can include a single insulating layer or a plurality of insulating layers. In the embodiment as illustrated in FIG. 8, insulating layers 812 and 814 are serially formed over the workpiece, wherein the insulating layers 812 and 814 have different compositions. For example, the insulating layer 812 can include a nitride, and the insulating layer 814 can include an oxide. The insulating layer 814 can help reduce capacitive coupling, and the insulating layer 812 can be an etch stop during drain contact formation. The insulating layer 812 can have a thickness in a range of approximately 20 nm to approximately 90 nm, and the insulating layer 814 can have a thickness in a range of approximately 50 nm to approximately 500 nm.

A masking layer (not illustrated) can be formed over the insulating layer 814 and patterned to include masking features that are disposed over portions where the drain regions of the transistor structures have been formed. The insulating layer 814 can be etched to provide a tapered profile, and the insulating layer 812 can be etched with or without the tapered profile. The masking layer may be removed after the insulating layer 814 is etched and before or after the insulating layer 812 is etched.

In other embodiments, the tapered edges of the insulating layer 814 can be formed using a variety of techniques. In an embodiment, the composition of the insulating layer 814 may change during or between depositions. For example, the insulating layer 814 can include a plurality of insulating films having different compositions. In another embodiment, a dopant, such as phosphorus, can be incorporated at an increasing concentration during a later part of the deposition. In still another embodiment, the stress within the insulating layer 814 can be changed by changing deposition parameters (e.g., radio frequency power, pressure, etc.) even though the composition is substantially the same throughout the thickness of the insulating layer 814. In further embodiments, combinations of the foregoing may be used. Particular etching techniques for the insulating layer 814 can include: isotropically etching the insulating layer 814; alternating etching a portion of the insulating layer 814 and etching a sidewall edge of the overlying mask features, etching another portion the insulating material and etching more of a sidewall of the overlying mask features, etc.; taking advantage of a differential composition (doped oxide etches faster than undoped oxide), or any combination thereof.

Figure 9:
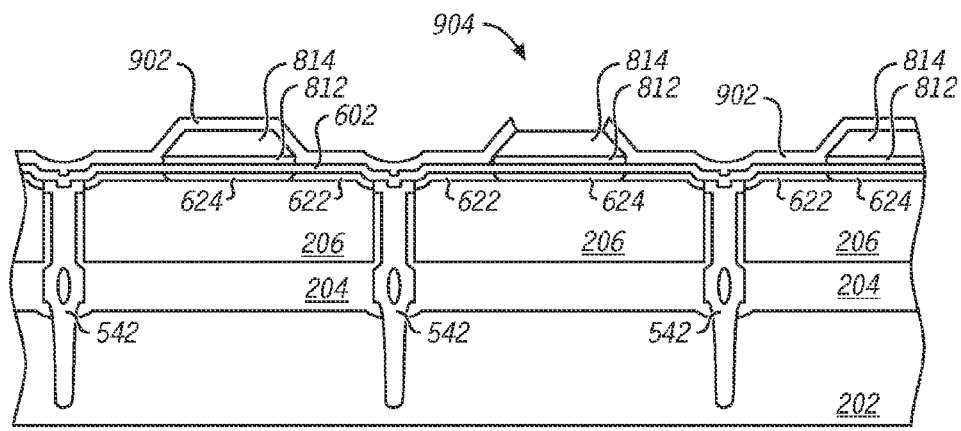
FIG. 9 includes an illustration of a cross-sectional view of the workpiece of FIG. 8 after forming a patterned conductive layer.

In FIG. 9, a conductive layer 902 is deposited over the insulating members 802 and patterned to form openings, such as an opening 904, where drain contact structures will be subsequently made to the drain regions 624 of transistor structures for the high-side power transistor 12. The conductive layer 902 includes a conductive material or may be made conductive, for example, by doping. More particularly, the conductive layer 902 can include a doped semiconductor material (e.g., heavily doped amorphous silicon, polysilicon, etc.), a metal-containing material (a refractory metal, a refractory metal nitride, a refractory metal silicide, etc.), or any combination thereof. The conductive layer 902 has a thickness in a range of approximately 0.05 micron to approximately 0.5 micron. In a particular embodiment, the conductive layer 902 will be used to form a conductive electrode.

Figure 10:
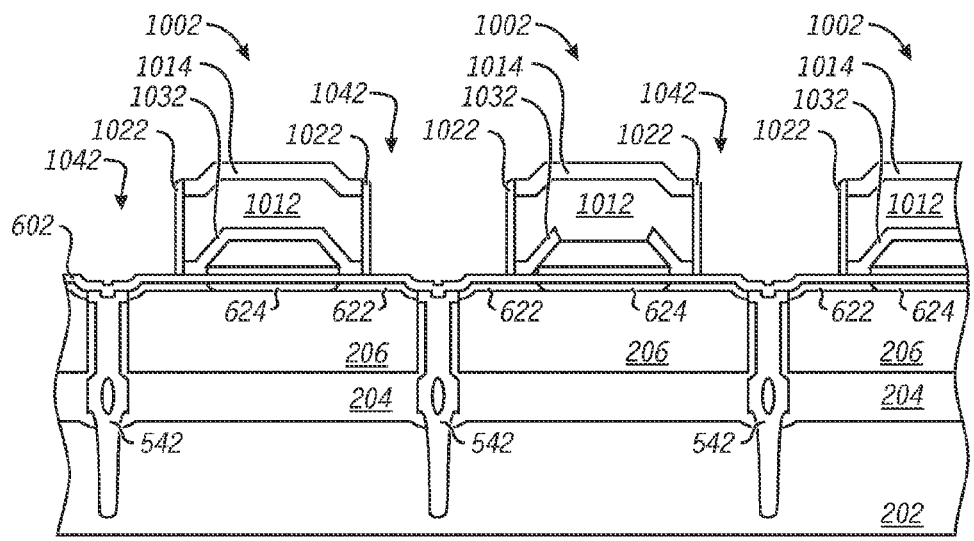
FIG. 10 includes an illustration of a cross-sectional view of the workpiece of FIG. 9 after forming insulating members and forming conductive electrodes from the patterned conductive layer.

FIG. 10 includes insulating members 1002 formed over the drain regions 624 and portions of the horizontally-oriented doped regions 622. The insulating members 1002 can be formed by forming one or more patterned insulating layers. In the embodiment as illustrated in FIG. 10, an insulating layer 1012 and an insulating layer 1014 are deposited over the conductive layer 902. The insulating layers 1012 and 1014 can include an oxide, a nitride, or any oxynitride, and in a particular embodiment, have different compositions as compared to each other. For example, the insulating layer 1012 can include an oxide, and the insulating layer 1014 can include a nitride. The insulating layer 1012 has a thickness in a range of approximately 0.2 micron to approximately 2.0 microns, and the insulating layer 1014 has a thickness in a range of approximately 20 nm to approximately 900 nm.

A masking layer (not illustrated) is formed over the insulating layer 1014 and patterned to form masking features that are disposed over the insulating layer 1014 at locations where the insulating members 1002 are formed. Portions of the conductive layer 902 and insulating layers 1012 and 1014 are patterned, and the masking features are removed. The patterning of the conductive layer 902 forms separate conductive electrodes 1032 for the high-side power transistor 12 and the low-side power transistor 14. The conductive electrodes 1032 for the high-side power transistor 12 will be electrically connected to the subsequently formed source regions for the high-side power transistor 12, and the conductive electrodes 1032 for the low-side power transistor 14 (not illustrated in FIG. 10) will be electrically connected to the subsequently-formed source regions for the low-side power transistor 14.

Insulating spacers 1022 are formed along the sidewalls of the conductive electrodes 1032 and the insulating layers 1012 and 1014. In a particular embodiment, the insulating spacers 1022 include a nitride and are formed by depositing a nitride layer to a thickness in a range of approximately 20 to 90 nm and anisotropically etching the nitride layer to form the insulating spacers 1022. Openings 1042 are disposed over portions of the semiconductor layer 206 where source and channel regions will be formed.

Figure 11:
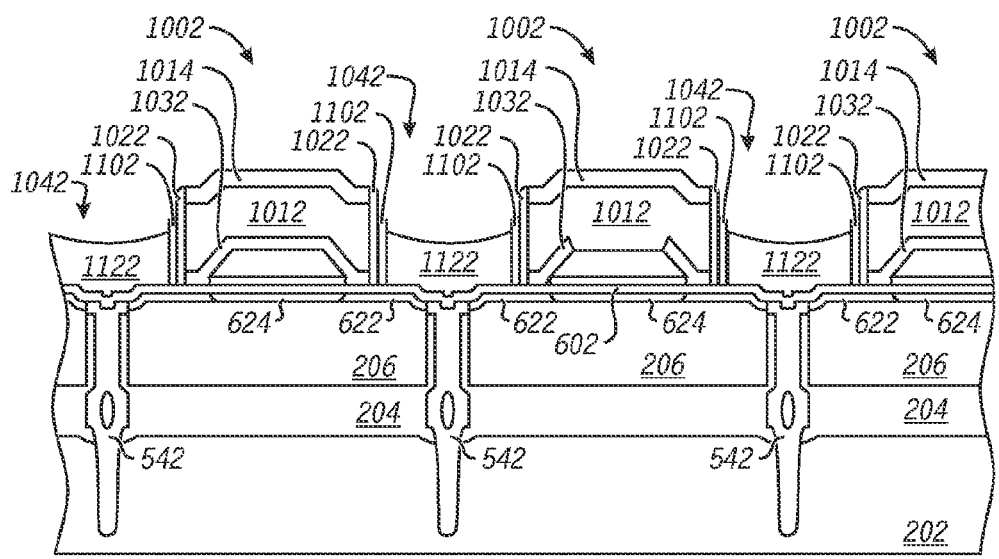
FIG. 11 includes an illustration of a cross-sectional view of the workpiece of FIG. 10 after forming sacrificial spacers and sacrificial members.

FIG. 11 includes sacrificial spacers 1102 and sacrificial members 1122 formed within the openings 1042. The widths of the sacrificial spacers 1102 correspond to the width of doped regions that will be formed at least partly within the horizontally-oriented doped regions 622. The significance of the subsequently-formed doped regions will be described later in this specification. The widths of the sacrificial spacers 1102, as measured at the base of the sacrificial spacers 1102 (hereinafter referred to as the "spacer widths"), may be at least approximately 0.11 times the depths of the horizontally-oriented doped regions 622. The spacer widths may be no greater than approximately 5 times the depths of the horizontally-oriented doped regions 622. In an embodiment, the spacer widths can be in a range of approximately 0.3 to approximately 2 times the depths of the horizontally-oriented doped regions 622. In another embodiment, the spacer widths are at least approximately 0.05 micron, and in still another embodiment, the spacer widths are no greater than approximately 0.3 micron.

The sacrificial members 1122 are disposed at portions of the openings 1042 near the horizontally-oriented doped regions 622. The sacrificial members 1122 have a thickness sufficient to substantially prevent doping of underlying regions, when the doping is performed after removing the sacrificial spacers 1102. In an embodiment, the sacrificial members 1122 have a thickness of at least approximately 100 nm. In another embodiment, the sacrificial members 1122 may fill approximately 10 to 70 percent of the depth of the openings 1042. The sacrificial members 1122 do not cover all of the top of the sacrificial spacers 1102, as the sacrificial spacers 1102 are selectively removed.

The sacrificial spacers 1102 have a different material as compared to the insulating layer 1014, insulating spacers 1022 of the insulating members 1002, and the sacrificial members 1122. The sacrificial members 1122 have a different material as compared to the insulating layer 1014 and insulating spacers 1022 of the insulating members 1002.

In a particular embodiment, the insulating layer 1014 and insulating spacers 1022 include a nitride, the sacrificial spacers 1102 include amorphous or polycrystalline silicon, and the sacrificial members 1122 include an organic resist material. The sacrificial spacers 1102 are formed by depositing a layer including amorphous or polycrystalline silicon to a thickness corresponding to the spacer widths, as previously discussed, and anisotropically etching the layer. The sacrificial members 1122 can be formed by coating the organic resist material over the workpiece and within the openings 1042. The organic resist material can be etched back to leave the sacrificial members 1122. In a particular embodiment, the organic resist material can be etched using endpoint detection set on detection of the insulating layer 1014, the insulating spacers 1022, or sacrificial spacers 1102. A timed etch can then be used to achieve the desired thickness of the sacrificial members 1122.

In another embodiment, the composition of the sacrificial spacers 1102 or sacrificial members 1122 can be changed. For example, sacrificial spacers 1102 or sacrificial members 1122 can include a metal-containing material. For example, the sacrificial spacers 1102 or sacrificial members 1122 may include tungsten. In still another embodiment, the sacrificial members 1122 can include an oxide. For example, a heavily doped, undensified deposited oxide has a relatively high etch rate as compared to thermal oxide or a densified oxide made from tetraethylorthosilicate.

If needed or desired, the sacrificial members 1122 may be reflowed. The reflow may be performed to reduce the likelihood of implant shadowing from portions of the sacrificial members 1122 that were disposed over portions of the sacrificial spacers 1102.

Figure 12:
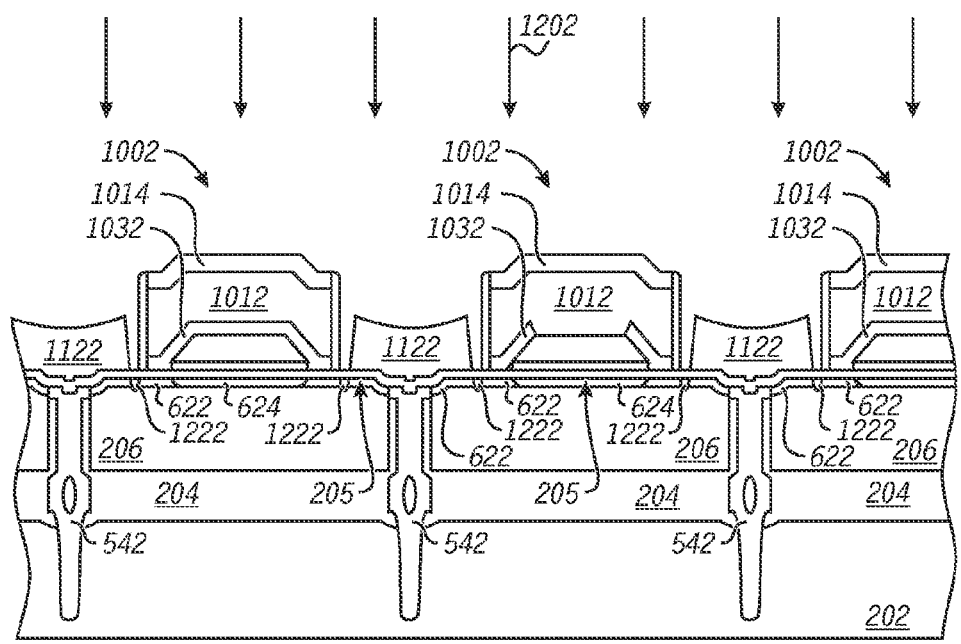
FIG. 12 includes an illustration of a cross-sectional view of the workpiece of FIG. 11 during an implant step after the sacrificial spacers have been removed.

FIG. 12 includes an illustration of the workpiece during a doping action to form doped regions 1222. The doping action can be performed as an implantation. In an embodiment, ions (illustrated by arrows 1202) are directed to the exposed surface of the workpiece at a substantially 0° tilt angle implant (that is, substantially perpendicular to the primary surface 205 of the semiconductor layer 206). In another embodiment, another angle may be used, and the workpiece may be rotated during or between portions of the implant to reduce the effects of shadowing caused by the insulating members. If channeling is a concern, the implant may be performed with an approximately 7° tilt angle. The implantation can be performed during 4 portions, wherein the workpiece is rotated approximately 90° between each of the portions.

The dopant concentration for the doped regions 1222 is greater than the dopant concentration of the horizontally-oriented doped regions 622. In an embodiment, the dopant concentration of the doped regions 1222 is no greater than approximately 9 times the dopant concentration of the horizontally-oriented doped regions 622. In a particular embodiment, the dopant concentration of the doped regions 1222 is in a range of approximately 2 to approximately 5 times a dopant concentration of the horizontally-oriented doped regions 622. In another particular embodiment when implantation is used, the dose may be in a range of approximately $2 \times 10^{12}$ ions/cm$^2$ to approximately $2 \times 10^{13}$ ions/cm$^2$.

The depths of the doped regions 1222 may not have specific limits. In an embodiment, the depths of the doped regions 1222 may not be more than approximately 0.2 micron deeper than the horizontally-oriented doped regions 622. If the doped regions 1222 are deeper, they may interfere with a subsequently-formed deep implanted regions. If the deep implanted regions are not formed, the doped regions 1222 can be deeper. In another embodiment, the doped regions 1222 may have depths that correspond to the principal current flows through the transistor structures of the high-side and low-side power transistors 12 and 14. During normal operation, if electrons flowing through the channel region are principally within 0.05 micron of the primary surface at the drain side of the channel region, the depths of the doped regions 1222 may be approximately 0.05 micron deep. In another embodiment, the depths of the doped regions 1222 may be in a range of approximately 0.5 to approximately 2 times the depths of the horizontally-oriented doped regions 622. In still another embodiment, the depths of the doped regions 1222 may be in a range of approximately 0.5 to approximately 2 times the widths of the sacrificial spacers 1102.

The energy of the implant can vary based on the dopant species selected. For example, when the implanting species is P$^+$ (phosphorus ions), the energy may be in a range of approximately 40 keV to approximately 150 keV, and when the implanting species is As$^+$, the energy may be in a range of approximately 100 keV to approximately 350 keV. If the high-side and low-side power transistors are p-channel transistors (rather than n-channel transistors), when the implanting species is B$^+$, the energy may be in a range of approximately 15 keV to approximately 50 keV, and when the implanting species is BF$_2$$^+$, the energy may be in a range of approximately 50 keV to approximately 180 keV.

After the doped regions 1222 are formed, the sacrificial members 1122 can be removed. The widths of the doped regions 1222 can be any of the width dimensions as previously described with respect to the spacer widths of the sacrificial spacers 1102.

Figure 13:
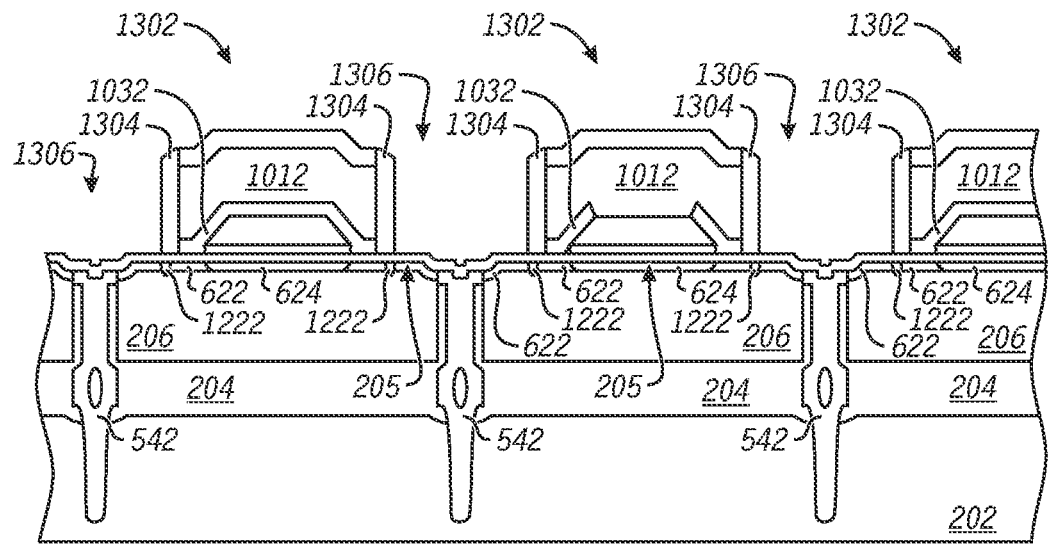
FIG. 13 includes an illustration of a cross-sectional view of the workpiece of FIG. 12 after removing the sacrificial members and forming insulating spacers.

FIG. 13 includes an illustration after forming another set of insulating spacers. The insulating spacers cover the doped regions 1222 so that they will not be counter doped when a channel implant is subsequently performed. Thus, the insulating spacers can have any of the width dimensions as previously described with respect to the spacer widths of the sacrificial spacers 1102. In a particular embodiment, the widths of the insulating spacers are in a range of approximately 0.8 to approximately 1.2 times the widths of the doped regions 1222. The insulating members 1302 are substantially the same as the insulating members 1002 with the addition of the insulating spacers. To simplify FIG. 13, the combination of the other set of insulating spacers and insulating spacers 1022 are illustrated as insulating spacers 1304. The insulating spacers 1304 can include a material different from the implant screen layer 602. In a particular embodiment, the insulating spacers 1304 can include a nitride. After forming the insulating members, openings 1306 are defined by the insulating members 1302.

Figure 14:
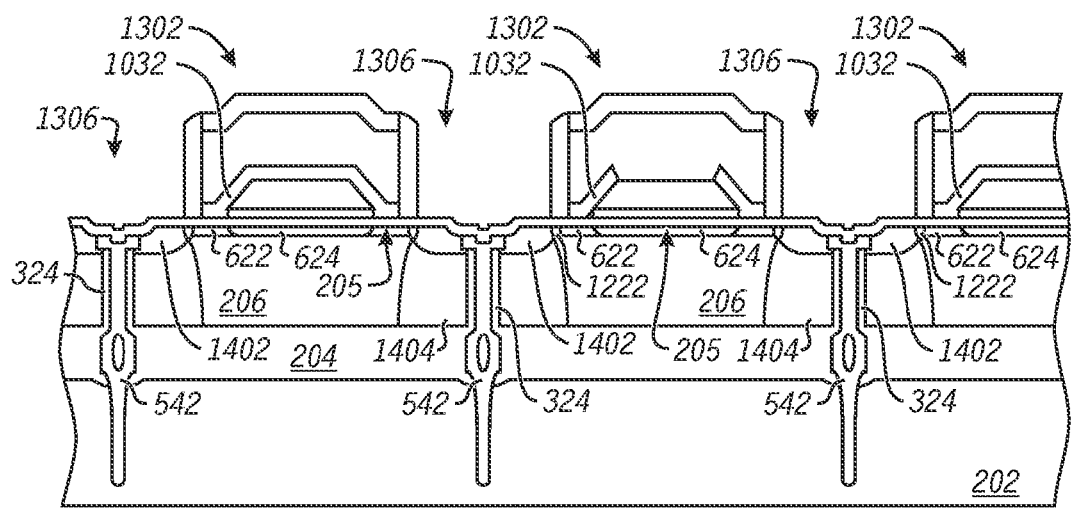
FIG. 14 includes an illustration of a cross-sectional view of the workpiece of FIG. 13 after forming channel regions and deep body doped regions.

FIG. 14 includes channel regions 1402 and deep body doped regions 1404 that are formed under the openings 1306. The channel regions 1402 are formed adjacent to the primary surface 205 of the semiconductor layer 206, and the deep body doped regions 1404 are spaced away from the primary surface 205. The deep body doped regions 1404 can provide alternative paths during avalanche breakdown between the drain regions 624 and the deep body doped regions 1404 as opposed to avalanche breakdown between the drain regions 624 and the channel regions 1402. Thus, if avalanche breakdown involving the drain regions 624 would occur, current flows through the deep body doped regions 1404 in preference to the channel regions 1402. Therefore, the channel regions 1402 are less likely to be permanently altered if avalanche breakdown occurs. The depths and concentrations of the deep body doped regions 1404 may be related to the depths and concentrations of the channel regions 1402.

If the depths of the deep body doped regions 1404 are shallow, current flowing during avalanche breakdown may include portions of the channel regions 1402. More particularly, if the uppermost depths of the deep body doped regions 1404 are very deep, the avalanche breakdown would occur between the drain regions 624 and the channel regions 1402, and thus, the deep body doped regions 1404 would not effectively protect the channel regions 1402. In an embodiment, the peak concentrations of the deep body doped regions 1404 are at least approximately 0.1 micron deeper than the peak concentrations of the channel regions 1402, and in another embodiment, the peak concentrations of the deep body doped regions 1404 are no greater than approximately 0.9 micron deeper than the peak concentrations of the channel regions 1402. In a further embodiment, the peak concentrations of the deep body doped regions 1404 are in a range of approximately 0.6 micron to approximately 1.1 microns below the primary surface 205.

In an embodiment, the deep body doped regions 1404 have greater dopant concentrations as compared to the channel regions 1402. In a particular embodiment, the peak concentrations of the deep body doped regions 1404 can be in a range of approximately 2 to approximately 10 times the peak dopant concentrations for the channel regions 1402.

The widths of the deep body doped regions 1404 can be wider than the openings 1306 between the insulating members 1302. The deep body doped regions 1404 can be formed by implantation, which can be characterized by a projected range ($R_p$) and straggle ($\Delta R_p$). $\Delta R_p$ can be used to approximate the lateral encroachment within the semiconductor layer 206 of the dopant during implant. Thus, significant portions of the deep body doped regions 1404 are disposed under the doped regions 1222.

The deep body doped regions 1404 can be formed using a single implant or a combination of implants. The deep body doped regions 1404 may or may not contact the buried insulating layer 204. As the range of depths of the deep body doped regions 1404 increases, current during avalanche breakdown can be spread over larger areas. In a particular embodiment, the deep body doped regions 1404 may be spaced apart from the buried insulating layer 204 to reduce capacitive coupling to the buried conductive region 202. In an another embodiment, the deep body doped regions 1404 may be in contact with the buried insulating layer 204 in order to suppress the parasitic field-effect transistor, wherein the gate dielectric includes the buried insulating layer 204. For a single implant or for the implant (of a combination of implants) having the lowest $R_p$, the dose can be in a range of approximately $5 \times 10^{13}$ ions/cm$^2$ to approximately $5 \times 10^{14}$ ions/cm$^2$.

The channel regions 1402 can be formed by ion implantation with a dose in a range of approximately $5 \times 10^{12}$ ions/cm$^2$ to approximately $5 \times 10^{13}$ ions/cm$^2$. The energy can be selected to achieve an $R_p$ in a range approximately 0.05 micron to approximately 0.3 micron.

The deep body doped regions 1404 may be formed before or after the channel regions 1402. In a particular embodiment, the deep body doped regions 1404 are formed, and portions of the implant screen layer 602 exposed within the openings 1306 are removed. Another implant screen layer (not illustrated) can be formed before forming the channel regions 1402. The other implant screen layer can be an oxide or a nitride. The other implant screen layer may be thinner than the implant screen layer 602. In a particular embodiment, the other implant screen layer is thermally grown to a thickness in a range of approximately 11 nm to approximately 50 nm. The ions for the channel regions 1402 may be implanted through the other screen implant layer.

Figure 15:
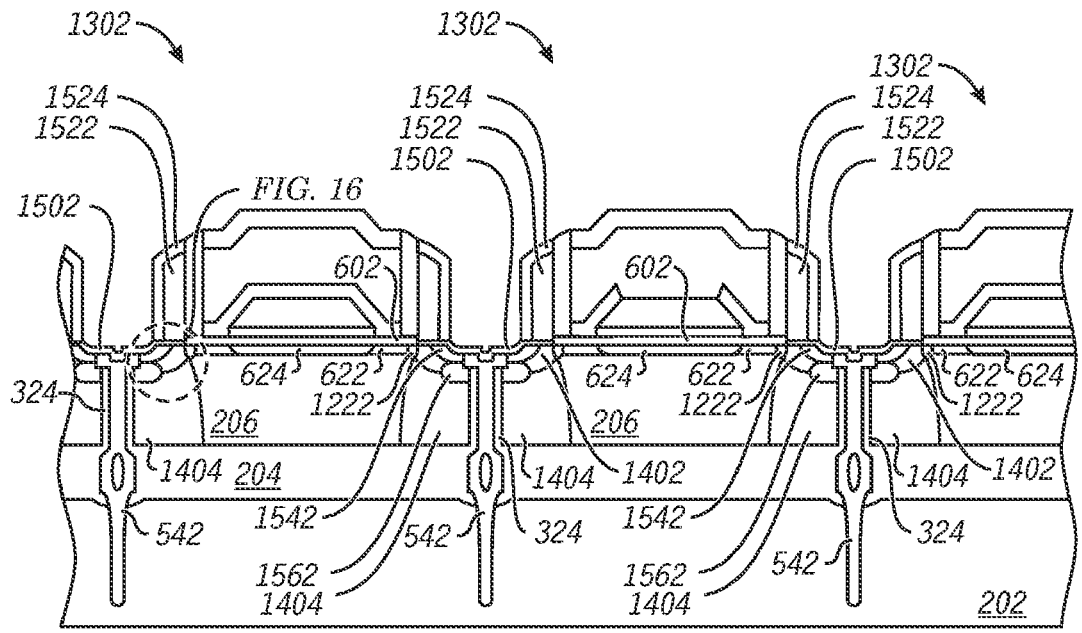
FIG. 15 includes an illustration of a cross-sectional view of the workpiece of FIG. 14 after forming gate electrodes, source extension regions, and body regions.

FIG. 15 includes an illustration of the workpiece after forming a gate dielectric layer 1502, gate electrodes 1522, an insulating layer 1524 along exposed surfaces of the gate electrodes 1522, source extension regions 1542, and body regions 1562. Exposed portions of the implant screen layer 602 and other implant screen layer(s), if present, are removed by etching, and the gate dielectric layer 1502 is formed over the exposed surface along the bottoms of the openings 1306. In a particular embodiment, the gate dielectric layer 1502 includes an oxide, a nitride, an oxynitride, or any combination thereof and has a thickness in a range of approximately 5 nm to approximately 100 nm. The gate electrodes 1522 are disposed over the gate dielectric layer 1502. The gate electrodes 1522 can be formed by depositing a layer of material that is conductive as deposited or can be subsequently made conductive. The layer of material can include a metal-containing or semiconductor-containing material. In an embodiment, the layer is deposited to a thickness of approximately 0.1 micron to approximately 0.5 micron. The layer of material is etched to form the gate electrodes 1522. In the illustrated embodiment, the gate electrodes 1522 are formed without using a mask and have shapes of sidewall spacers.

The insulating layer 1524 can be thermally grown from the gate electrodes 1522 or may be deposited over the workpiece. The thickness of the insulating layer 1524 can be in a range of approximately 10 nm to approximately 30 nm. The source extension regions 1542 can have a dopant concentration higher than approximately $5 \times 10^{17}$ atoms/cm$^3$ and less than approximately $5 \times 10^{19}$ atoms/cm$^3$. The body regions 1562 can allow the channel regions 1402 and deep body doped regions 1404 to be electrically joined and reduce the likelihood of having a more resistive region between the channel regions 1402 and the deep body doped regions 1404, as compared to not having the body regions 1562. The body regions 1562 can also reduce the likelihood of punchthrough between the source and drain of the transistor structures. The body regions 1562 have the same conductivity type as the channel regions 1402 and the deep body doped regions 1404 and have a peak dopant concentration of at least approximately $1 \times 10^{18}$ atoms/cm$^3$.

Figure 16:
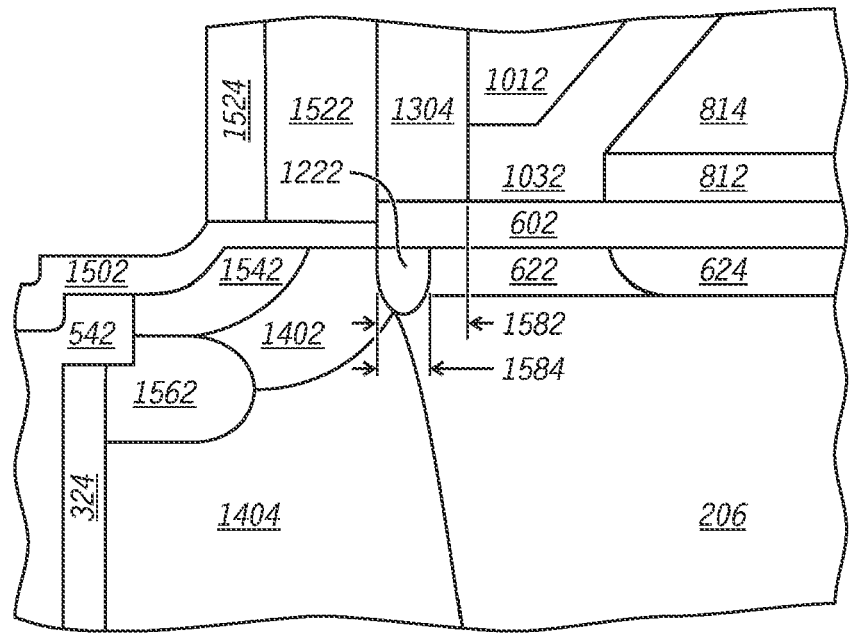
FIG. 16 includes an illustration of an enlarged view of the workpiece at the location as noted in FIG. 15.

FIG. 16 illustrates positional relationships between the features of the workpiece in FIG. 15. Distance 1582 corresponds to the distance between the gate electrode 1522 and the conductive electrode 1032, and width 1584 corresponds to the width of the doped region 1222. As illustrated in the embodiment of FIG. 16, the right-hand edge of the doped region 1222 may extend laterally to a point under the interface between the insulating spacer 1304 and the conductive electrode 1032. In an alternative embodiment, the right-hand edge of the doped region 1222 may extend laterally to a point under the conductive electrode 1032. In a particular embodiment, the lateral extension of the right-hand edge of the doped region 1222 does not lie under either insulating layers 812 and 814. The left-hand edge of the doped regions 1222 may extend laterally to a point within the channel region 1402. The width 1584 may be up to approximately 1.5 times the distance 1582, and in a particular embodiment, the width 1584 may be up to approximately 1.2 times the distance 1582. The width 1584 has no known lower limits. In an embodiment, the width 1584 may be at least approximately 0.2 times the distance 1582, and in another embodiment, the width 1584 may be at least approximately 0.4 times the distance 1582.

Figure 17:
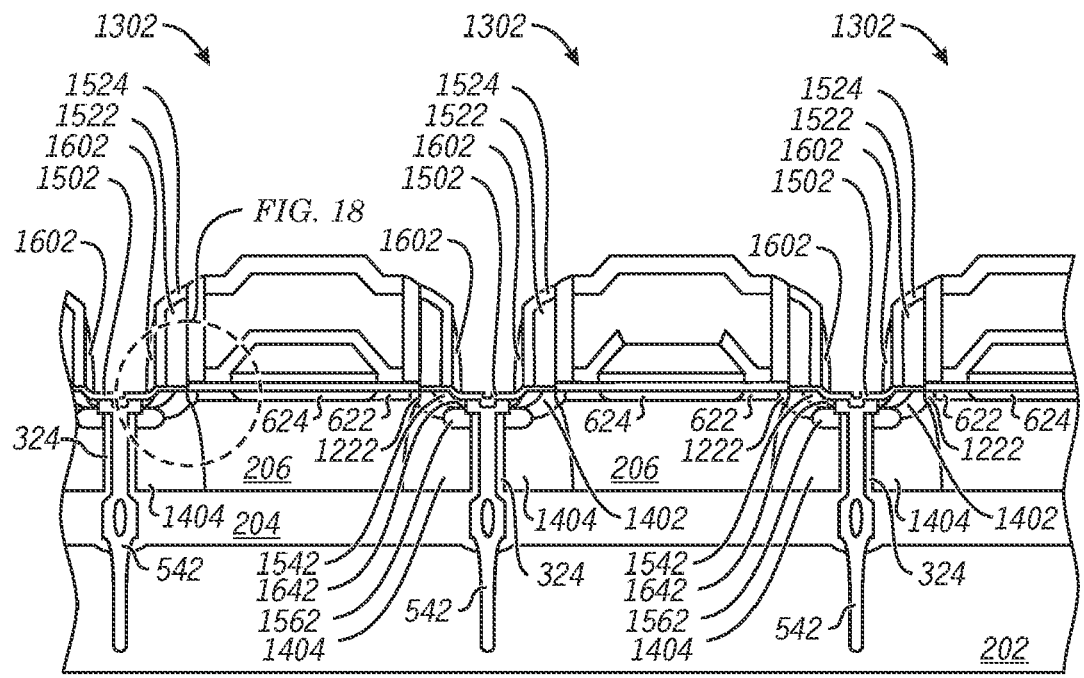
FIG. 17 includes an illustration of a cross-sectional view of the workpiece of FIG. 15 after forming insulating spacers and heavily doped source regions.
Figure 18:
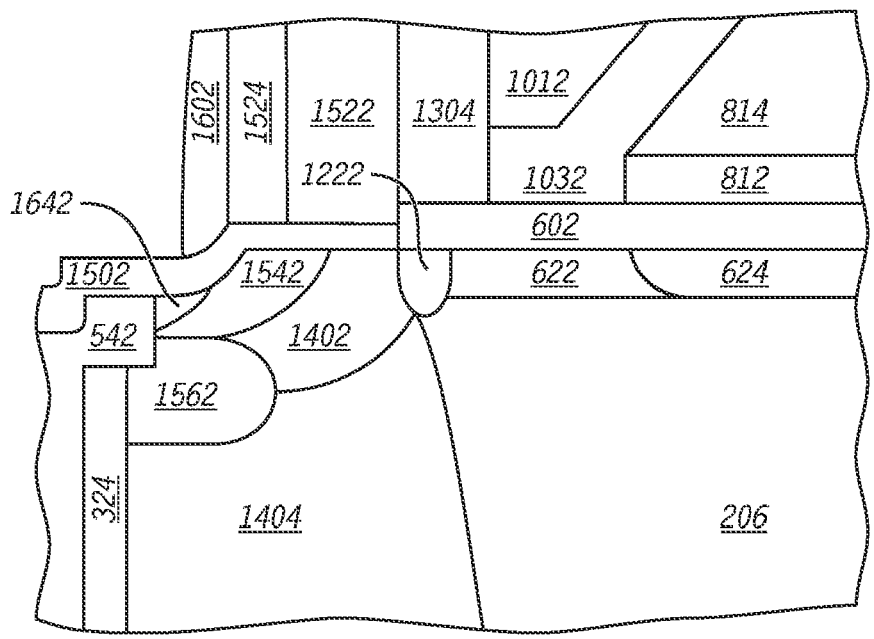
FIG. 18 includes an illustration of an enlarged view of the workpiece at the location as noted in FIG. 17.

FIG. 17 includes insulating spacers 1602 and heavily doped source regions 1642. FIG. 18 includes an enlarged view of a portion of FIG. 17 to illustrate better positional relationships between the features of the workpiece. The insulating spacers 1602 are formed to cover portions of the source extension regions 1542. The insulating spacers 1602 can be formed by depositing an insulating layer and anisotropically etching the insulating layer. The insulating spacers 1602 can include an oxide, a nitride, an oxynitride, or any combination thereof, and have widths at the bases of the insulating spacers 1602 in a range of approximately 50 nm to approximately 200 nm. The heavily doped source regions 1642 allow ohmic contacts to be subsequently made and have a dopant concentration of at least approximately $1\times10^{19}$ atoms/cm$^3$. The heavily doped source regions 1642 can be formed using ion implantation. The heavily doped source regions 1642 have an opposite conductivity type as compared to the channel regions 1402 and the same conductivity type as the drain regions 624 and the buried conductive region 202.

Figure 19:
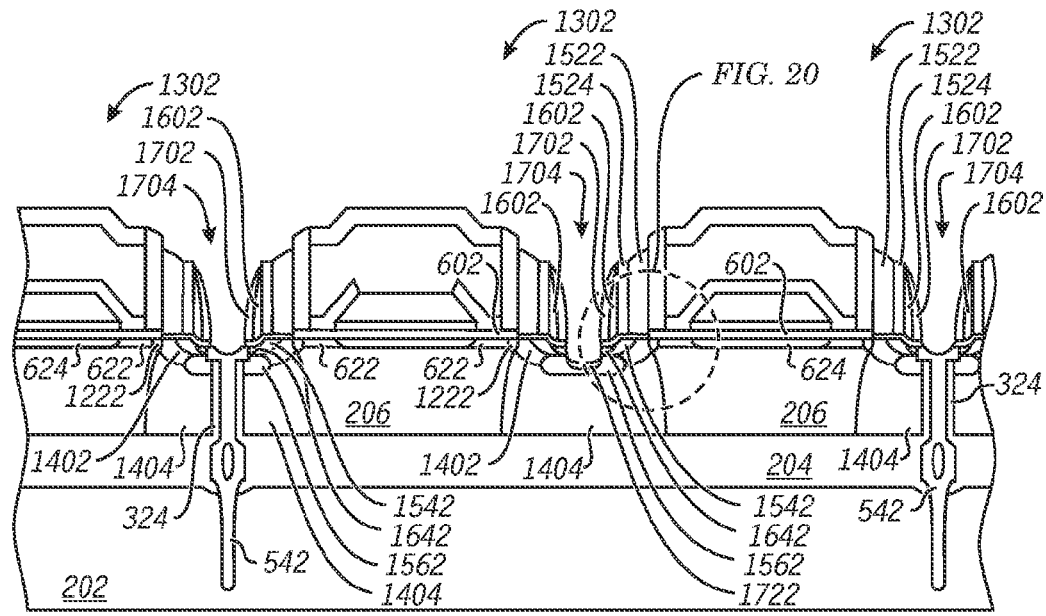
FIG. 19 includes an illustration of a cross-sectional view of the workpiece of FIG. 17 after forming another set of spacers, etching portions of the heavily doped source regions, and forming heavily doped body contact regions.
Figure 20:
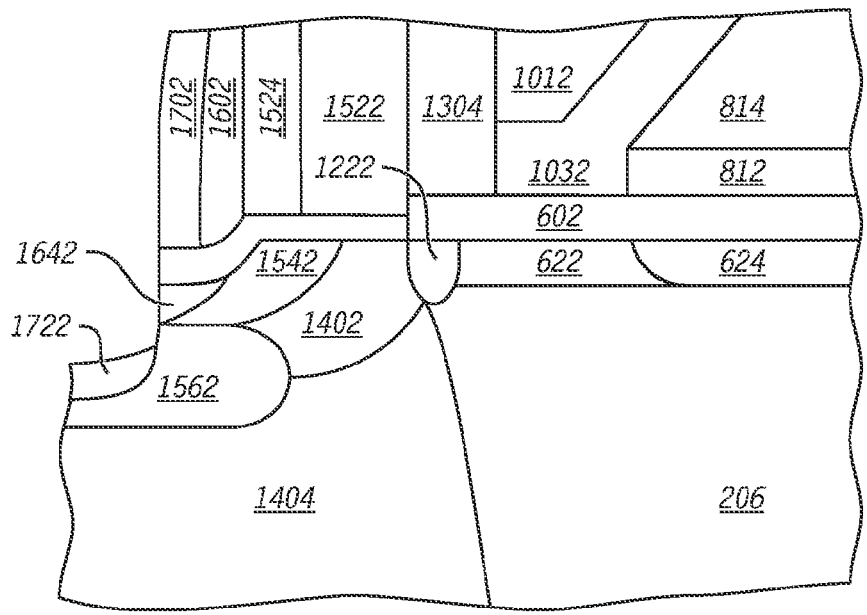
FIG. 20 includes an illustration of an enlarged view of the workpiece at the location as noted in FIG. 19.

FIG. 19 includes spacers 1702, openings 1704, and heavily doped body contact regions 1722. FIG. 20 includes an enlarged view of a portion of FIG. 19 to illustrate better positional relationships between the features of the workpiece. As compared to FIG. 17, FIGS. 19 and 20 do not illustrate the vertically-oriented conductive region 542 near the center of FIG. 17. In an embodiment, the locations of the vertically-oriented conductive region 542 may be offset compared to one another to allow a more compact layout of the transistors. For example, a corresponding vertically-oriented conductive region 542 that contacts the heavily doped source region 1642 near the middle of FIGS. 19 and 20 may be located further back and not lie along the plane of FIGS. 19 and 20. In another embodiment, the heavily doped source regions 1642 of the high-side transistor structures can be in the form of a single heavily doped source region, and the heavily doped source regions 1642 of the low-side transistor structures (not illustrated in FIGS. 19 and 20) can be in the form of a different heavily doped single source region. Thus, the vertically-oriented conductive region 542 does not need to extend through every portion of the heavily doped source regions 1642 between the corresponding gate electrode 1522 of the same transistor structure.

In FIGS. 19 and 20, the spacers 1702 are formed to define portions where the heavily doped body contact regions 1722 will be formed. The spacers 1702 can be formed by depositing an insulating layer and anisotropically etching the insulating layer. The spacers 1702 can include an oxide, a nitride, an oxynitride, or a combination thereof. In a particular embodiment, the spacers 1702 can be sacrificial spacers that are removed after forming the heavily doped body contact regions. Thus, the spacers 1702 do not have to be an insulating material. Openings 1704 are partly defined by the sides of the spacers 1702 that face each other.

Along the bottoms of the openings 1704, portions of the gate dielectric layer 1502 and heavily doped source regions 1642 are etched. The heavily doped body contact regions 1722 are then formed along the bottoms of the openings 1704. The heavily doped body doped regions 1722 have the same conductivity type as the channel regions 1402 and the deep body doped regions 1404 and have a dopant concentration of at least approximately $1\times10^{19}$ atoms/cm$^3$ to allow ohmic contacts to be subsequently formed.

The body regions 1562 and the heavily doped body contact regions 1722 help to ensure that good electrical contact is made with the vertically-oriented conductive regions 542 (when the vertically-oriented conductive regions 542 include a metal-containing material) and to subsequently-formed metal silicide regions. In another embodiment, the body regions 1562 may be formed, and the heavily doped body contact regions 1722 are not formed. In another embodiment, heavily doped body contact regions 1722 are formed, and the body regions 1562 are not formed. After reading this specification, skilled artisans will be able to determine the electrical performance that they need or desire and determine whether the body regions 1562, the heavily doped body contact regions 1722, or combinations of body regions 1562 and the heavily doped body contact regions 1722 should be implemented.

Figure 21:
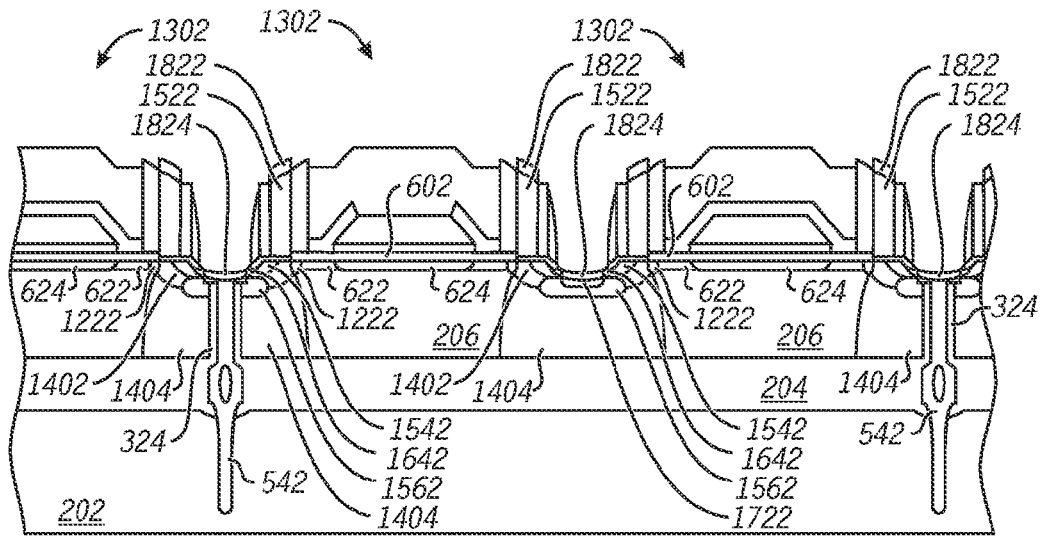
FIG. 21 includes an illustration of a cross-sectional view of the workpiece of FIG. 19 after forming silicide members.

FIG. 21 includes conductive members 1822 and 1824. In an embodiment, part or all of the spacers 1702 are removed to expose more of the heavily doped source regions 1642. Conductive members 1822 are formed over the gate electrodes 1522 and allow for better contact and lower resistance. Conductive members 1824 electrically connect the heavily doped source regions 1642, heavily doped body contact regions 1722, and where present, the vertically-oriented conductive regions 542 to one another. In a particular embodiment, a refractory metal, such as Ti, Ta, W, Co, Pt, or the like, can be deposited over the workpiece and selectively reacted with exposed silicon, such as substantially monocrystalline or polycrystalline silicon, to form a metal silicide. Unreacted portions of the refractory metal that overlie the insulating materials are removed, thus leaving the conductive members 1822 and 1824. At this point in the process, the transistor structures for the high-side and low-side power transistors 12 and 14 are formed.

Figure 22:
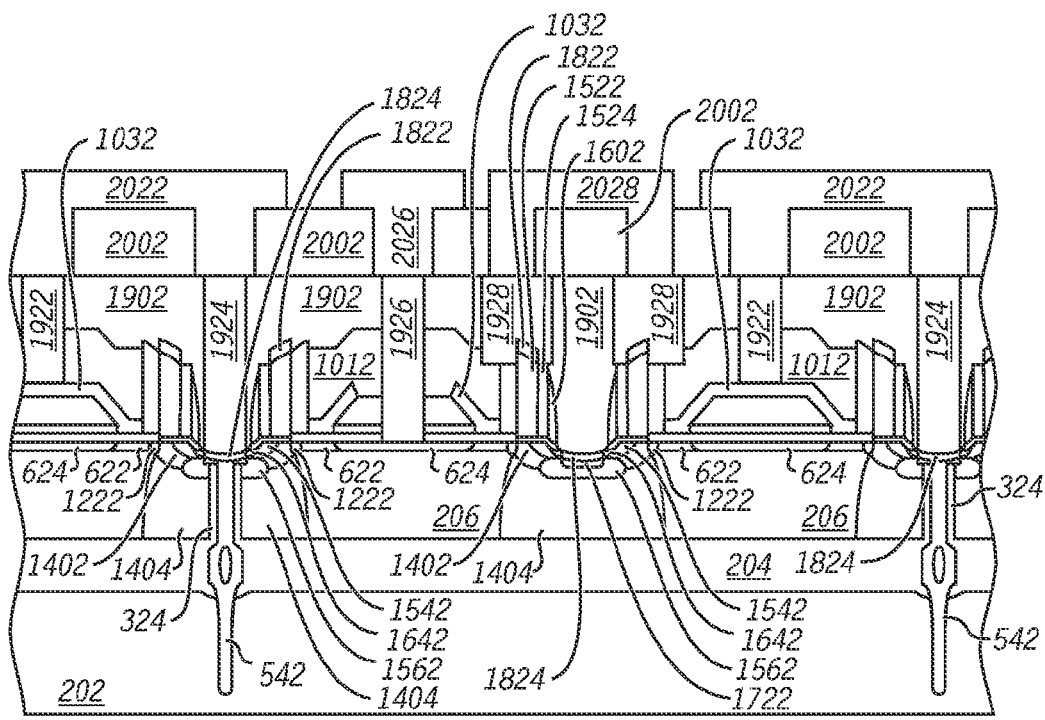
FIGS. 22 and 23 include illustrations of cross-sectional views of the workpiece of FIG. 21 after forming a first level of interconnects for transistor structures of the high-side and low-side transistors.
Figure 23:
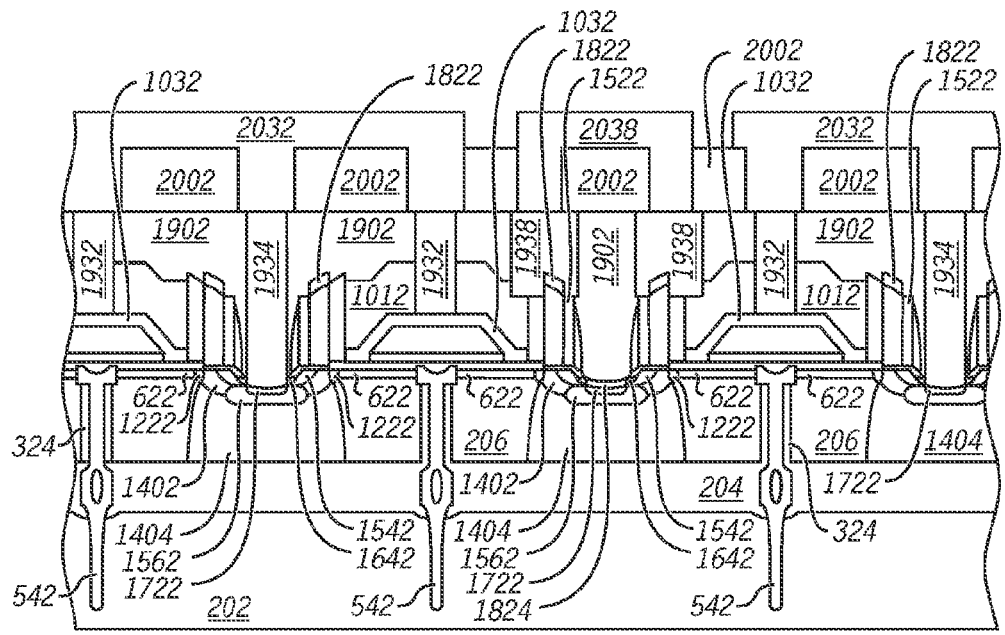

FIGS. 22 and 23 includes illustrations of transistor structures within the high-side power transistor 12 (FIG. 22) and the low-side power transistor after a first level of interconnects are formed. An interlevel dielectric (ILD) layer 1902 is formed and can include an oxide, a nitride, an oxynitride, or any combination thereof. The ILD layer 1902 can include a single film having a substantially constant or changing composition (e.g., a high phosphorus content further from the semiconductor layer 206) or a plurality of discrete films. An etch-stop film, an antireflective film, or a combination may be used within or over the ILD layer 1902 to help with processing. The ILD layer 1902 may be planarized to improve process margin during subsequent processing operations (for example, lithography, subsequent polishing, or the like).

In the embodiment as illustrated in FIGS. 22 and 23, the ILD layer 1902 is patterned to define contact openings, and conductive plugs 1922, 1924, 1926, 1928, 1932, 1934, and 1938 are formed within the contact openings. The conductive plugs 1922 and 1932 contact the conductive electrodes 1032 within the high-side and low-side transistors, respectively. The conductive plugs 1924 and 1934 contact the conductive members 1824 that contact the heavily doped source regions 1642 and heavily doped body contact regions 1722. The conductive plugs 1924 and 1934 are within the high-side and low-side transistors, respectively. The conductive plugs 1926 contact the drain regions 624 within the high-side transistor 12. Note that no conductive plugs contact the drain regions 624 within the low-side transistor 14. The conductive plugs 1928 and 1938 contact the conductive members 1822 that are disposed over the gate electrodes 1522 within the high-side and low-side transistors, respectively.

Many other conductive plugs are formed, and such other conductive plugs would be visible in other views. Although not illustrated in FIGS. 22 and 23, substantially all conductive electrodes 1032 within the high-side transistor 12 are electrically connected to the conductive plugs 1922, and substantially all conductive electrodes 1032 within the low-side transistor 14 are electrically connected to the conductive plugs 1932. Substantially all conductive members 1824 within the high-side transistor 12 are electrically connected to either the conductive plugs 1924 or vertically-oriented conductive regions 542, and substantially all conductive members 1824 within the low-side transistor 14 are electrically connected to the conductive plugs 1934. Substantially all conductive members 1822 within the high-side transistor 12 are electrically connected to the conductive plugs 1928, and substantially all conductive members 1822 within the low-side transistor 14 are electrically connected to the conductive plugs 1938. Thus, substantially all gate electrodes 1522 within the high-side transistor 12 are electrically connected to the conductive plugs 1928, and substantially all gate electrodes 1522 within the low-side transistor 14 are electrically connected to the conductive plugs 1938. Substantially all drain regions 624 within the high-side transistor 12 are electrically connected to the conductive plugs 1926, and substantially all horizontally-oriented doped regions 622 within the low-side transistor 14 are electrically connected to the vertically-oriented conductive regions 542.

Another interlevel dielectric (ILD) layer 2002 is formed and can include an oxide, a nitride, an oxynitride, or any combination thereof. The ILD layer 2002 can include any of the compositions as previously described with respect to the ILD layer 1902. The ILD layer 2002 can have substantially the same composition or a different composition as compared to the ILD layer 1902. The ILD layer 2002 is patterned to define contact openings.

Interconnects 2022, 2026, 2032, and 2038 are formed that extend at least partly within the contact openings within the ILD layer 2002. The interconnects 2022 electrically connect the conductive electrode 1032 and the conductive members 1824 within the high-side transistor 12. The interconnects 2032 electrically connect the conductive electrode 1032, the conductive members 1824 within the low-side transistor 14, and the $V_S$ terminal (FIG. 1). The interconnects 2026 (one of which is illustrated in FIG. 22) electrically connect the drain regions 624 within the high-side transistor 12 and the $V_D$ terminal (FIG. 1). The interconnects 2038 (one of which is illustrated in FIG. 23) electrically connect the gate electrodes within the low-side transistor 14 and the control unit 16 (FIG. 1). Although not illustrated, other interconnects electrically connect the gate electrodes 1522 within the high-side transistors 12 and the control unit 16.

Although not illustrated, additional or fewer layers or features may be used as needed or desired to form the electronic device. Field isolation regions are not illustrated but may be used to help electrically isolate portions of the high-side power transistors from the low-side power transistors. In another embodiment, more insulating and interconnect levels may be used. A passivation layer can be formed over the workpiece or within the interconnect levels. After reading this specification, skilled artisans will be able to determine layers and features for their particular application.

The electronic device can include many other transistor structures that are substantially identical to the transistor structures as illustrated in FIGS. 22 and 23. The transistor structures in FIG. 22 can be connected in parallel to each other to form the high-side power transistor 12, and the transistor structures in FIG. 23 can be connected in parallel to each other to form the low-side power transistor 14. Such a configuration can give a sufficient effective channel width of the electronic device that can support the relatively high current flow that is used during normal operation of the electronic device. In a particular embodiment, each power transistor may be designed to have a maximum source-to-drain voltage difference of approximately 30 V, and a maximum source-to-gate voltage difference of approximately 20 V. During normal operation, the source-to-drain voltage difference is no greater than approximately 20 V, and the source-to-gate voltage difference is no greater than approximately 9 V.

In still another embodiment, one or more bipolar transistors may be used instead of the field-effect transistors. In this embodiment, current carrying electrodes can include emitter regions and collector regions instead of the source regions and drain regions, and control electrodes can include base regions instead of gate electrodes. An emitter of a high-side bipolar transistor can be electrically connected to a collector of a low-side bipolar transistor. If a buried collector is used, the buried collector can be patterned to allow a properly isolated connection to be made to the buried conductive region 202.

Embodiments as described herein may include regions having a peak dopant concentration of less than approximately $1 \times 10^{19}$ atoms/cm$^3$. Should an ohmic contact with a metal-containing material be needed or desired, a portion of such doped region may be locally doped to have a peak dopant concentration of at least approximately $1 \times 10^{19}$ atoms/cm$^3$. In a non-limiting example, the buried conductive region 202 may have a peak dopant concentration less than approximately $1 \times 10^{19}$ atoms/cm$^3$. If the vertical conductive structures 422 include W or WSi, portions of the buried conductive region 202 near the vertical conductive structures 422 may be implanted to increase locally the peak dopant concentration to be at least approximately $1 \times 10^{19}$ atoms/cm$^3$ to help form ohmic contacts between the buried conductive region 202 and vertical conductive structures 422. In other embodiment, the conductivity types may be reversed. As described herein, n-channel transistor structures are illustrated. In an alternative embodiment, p-channel transistor structures can be formed.

Figure 24:
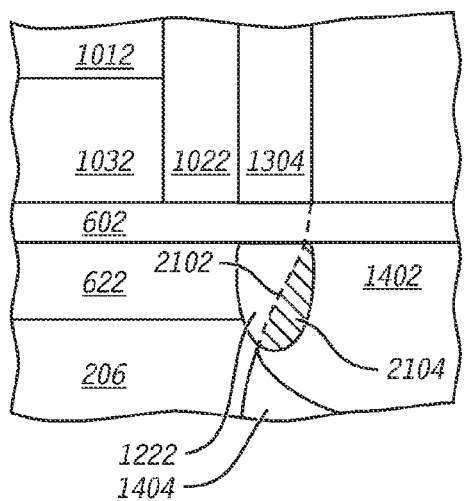
FIG. 24 includes an illustration of a cross-sectional view of an enlarged portion of the workpiece of FIG. 14 to illustrate a potential doping profile due to implant straggle.

The doped regions 1222 can help to reduce the likelihood of counter doping due to implant straggle when forming the channel regions 1402, the deep body doped regions 1404, or the combination of the channel regions 1402 and deep body doped regions 1404. Straggle is caused by ions colliding with the material within semiconductor layer 206 (for example, silicon atoms, germanium atoms, or the like) and become deflected at an angle different from the tilt angle of the implant. FIG. 24 includes an illustration that may depict how straggle affects the doping near the channel region 1402 and will be described after addressing how $\Delta R_p$, as a function of $R_p$, is affected by implant energy.

When expressed as a fraction $\Delta R_p/R_p$, the fraction decreases as the implant energy increases. For B$^+$, at 20 keV, $\Delta R_p/R_p$ is approximately 0.39; at 100 keV, $\Delta R_p/R_p$ is approximately 0.22, and at 200 keV, $\Delta R_p/R_p$ is approximately 0.18. The channel regions 1402 can be formed at a significantly lower implant energy as compared to the deep body doped regions 1404. Put in other terms, at 20 keV, a significant amount of dopant may extend laterally approximately 28 nm under the insulating spacer 1304 at a depth of approximately 71 nm. At 100 keV, the lateral dimension can be approximately 73 nm at a depth of approximately 330 nm, and at 200 keV, the lateral dimension can be approximately 100 nm at a depth of approximately 560 nm.

Thus, a significant amount of dopant can laterally extend under the insulating spacer 1304. In FIG. 24, straggle may be conceptually represented by the dashed line 2102, and the portion of doped region 1222 affected by straggle can be represented by the hatched portion of the doped region 1222. In the absence of the doped regions 1222, a similar effect would occur with the horizontally-oriented doped region 622. Due to the dopant levels, a portion of the horizontally-oriented doped region 622 could be partly or completely counter doped. From an electrical standpoint, the effective doping in the horizontally-oriented doped region 622 would be lower, and if complete counter doping occurs within a portion of the horizontally-oriented doped region 622, the threshold voltage and effective channel length of the transistor structure increases. In either scenario, $Rds_{on}$ may become unacceptably high.

The presence of the doped regions 1222 reduces the net amount of counter doping near the channel regions 1402 when forming the channel regions 1402, the deep body doped regions 1404, or a combination of the channel regions 1402 and deep body doped regions 1404. Thus, an acceptable $Rds_{on}$ region can still be achieved without having to increase the doping concentration of the horizontally-oriented doped regions 622 at locations spaced farther from the channel regions 1402. Thus, the main parts of the drift regions (the parts of horizontally-oriented regions doped 622 between the drain regions 624 and the doped regions 1222) can be substantially unaffected. The width of the doped regions 1222 is relatively narrow, so that the resistance through the drift region is primarily governed by the portions of the horizontally-oriented regions 622 disposed between the drain regions 624 and the doped regions 1222.

There are benefits to changing the doping concentration in the portion of the drift region adjacent to the channel region independent of the rest of the drift region. When the doped regions 1222 are localized adjacent to the drain edges of the channel regions 1402, the impact on both breakdown voltage and threshold voltage can be reduced while still realizing an improvement in the control of the net doping concentration in this region. As compared to doping the entire drift region, embodiments as described herein can have a reduced amount of the counter doping near the channel region 1402, and therefore, the breakdown voltage between the drain and channel region of the transistor structure is less likely to decrease and the output capacitance is less likely to increase. Furthermore, embodiments as described herein reduce the likelihood that the drift region overlaps the channel region. Thus, the channel region also is less likely to be counter-doped which can decrease the threshold voltage. Accordingly, the corresponding dose of the implant forming the channel region does not need to be increased, which would have the undesirable effect of also increasing the counter doping of the drift region. Thus, embodiments with the doped regions 1222 help to provide improved control of the dopant concentration without adversely affecting electrical performance of the transistor structures.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a drain region of a transistor, wherein the drain region has a first conductivity type. The electronic device can also include a channel region of the transistor, wherein the channel region has a second conductivity type opposite the first conductivity type. The electronic device can further include a first doped region having the first conductivity type, wherein the first doped region extends from the drain region towards the channel region. The electronic device can still further include a second doped region having the first conductivity type, wherein the second doped region is disposed between the first doped region and the channel region.

In an embodiment of the first aspect, each of the first doped region and the second doped region lie along a primary surface of a semiconductor layer. In another embodiment, the second doped region has a width that is at least 0.11 times the depth of the first doped region. In a particular embodiment, the second doped region has a width that is no greater than approximately 5 times the depth of the first doped region. In still another embodiment, the second doped region has a width that is in a range of approximately 0.3 to approximately 2 times a depth of the first doped region. In yet another embodiment, a width of the second doped region is no greater than approximately 0.5 times a width of the first doped region. In a particular embodiment, the width of the second doped region is at least approximately 0.05 times the width of the first doped region. In a further embodiment, the second doped region has a width no greater than approximately 0.3 micron. In a particular embodiment, the second doped region has a width of at least approximately 0.05 micron.

In still a further embodiment of the first aspect, a peak dopant concentration of the second doped region is greater than a peak dopant concentration of the first doped region. In a yet a further embodiment, a peak dopant concentration of the second doped region is no greater than approximately 9 times a peak dopant concentration of the first doped region. In another embodiment, a peak dopant concentration of the second doped region is in a range of approximately 2 to approximately 5 times a peak dopant concentration of the first doped region. In still another embodiment, a peak dopant concentration of the second doped region is greater than a peak dopant concentration of the channel region. In a particular embodiment, a peak dopant concentration of the second doped region is no greater than approximately 20 times a peak dopant concentration of the channel region. In yet another embodiment, a peak dopant concentration of the second doped region is in a range of approximately 5 to approximately 11 times a peak dopant concentration of the first doped region.

In a second aspect, a process of forming an electronic device can include forming a drain region of a transistor, wherein the drain region is formed along a primary surface of a semiconductor layer and has a first conductivity type. The process can also include forming a first doped region along the primary surface and having the first conductivity type, forming a second doped region along the primary surface and having the first conductivity type, and forming a channel region of the transistor, wherein the channel region is formed along the primary surface and has a second conductivity type opposite the first conductivity type. After forming the drain region, first doped region, second doped region, and the channel region, the first doped region is disposed between the drain region and the second doped region, and the second doped region is disposed between the first doped region and the channel region.

In an embodiment of the second aspect, forming the second doped region is performed after forming the drain region and the first doped region and before forming the channel region. In another embodiment, the process further includes forming a first spacer and removing the first spacer, wherein forming the second doped region is performed such that the second doped region is within the semiconductor layer at a location below where the first spacer was removed. In a particular embodiment, forming the second doped region is performed using a selective, self-aligned technique.

In another particular embodiment of the second aspect, the process further includes forming a first layer over the primary surface, patterning the first layer to define a first layer opening, forming a second layer over the primary surface after forming the first spacer, and removing portions of the second layer that overlie the first layer, wherein removing portions is performed before removing the first spacer. In a more particular embodiment, forming the spacer includes forming a first spacer layer over the first layer and within the first layer opening and anisotropically etching the first spacer layer to form the first spacer. In another more particular embodiment, the first layer has a composition different from the first sidewall spacer and the second layer, and the second layer has a composition different from the first sidewall spacer.

In still another more particular embodiment of the second aspect, the process further includes forming a third layer over the primary surface before forming the first layer, patterning the third layer to define a third layer opening, and forming a second sidewall spacer before forming the first sidewall spacer. In an even more particular embodiment, the first layer has a composition different from the first sidewall spacer, the second layer, and the third layer; and the second layer has a composition different from the first sidewall spacer, the second sidewall spacer, and the third layer. The third layer has a composition different from the first sidewall spacer, and the first sidewall spacer has a composition different from the second sidewall spacer. In another even more particular embodiment, each of the first layer and the second sidewall spacer includes a nitride, the second layer includes an organic resist material, the third layer includes an oxide, and the first sidewall spacer includes amorphous silicon or polycrystalline silicon.

In a further particular embodiment, a width of the second doped region and a width of the first sidewall spacer at its base are substantially equal. In yet another embodiment, forming the first doped region includes implanting a first dopant into the semiconductor layer, and forming the second doped region includes implanting a second dopant into a portion of the first doped region. In a particular embodiment, forming the second doped region is performed at a dose in a range of approximately $2\times10^{12}$ ions/cm$^2$ to approximately $2\times10^{13}$ ions/cm$^2$. In another particular embodiment, forming the second doped region is performed using phosphorus ions at an energy in a range of approximately 60 keV to approximately 160 keV.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
   a drain region of a transistor, wherein the drain region has a first conductivity type;
   a channel region of the transistor, wherein the channel region has a second conductivity type opposite the first conductivity type;
   a first doped region having the first conductivity type, wherein the first doped region extends from the drain region towards the channel region; and
   a second doped region having the first conductivity type, wherein the second doped region is disposed between the first doped region and the channel region,
   wherein the first doped region has a peak dopant concentration lower than peak dopant concentrations of the drain region and the second doped region.

2. The electronic device of claim 1, wherein each of the first doped region and the second doped region lie along a primary surface of a semiconductor layer.

3. The electronic device of claim 1, wherein the second doped region has a width that is at least 0.11 times the depth of the first doped region.

4. The electronic device of claim 3, wherein the second doped region has a width that is no greater than approximately 5 times the depth of the first doped region.

5. The electronic device of claim 1, wherein the second doped region has a width that is in a range of approximately 0.3 to approximately 2 times a depth of the first doped region.

6. The electronic device of claim 1, wherein a width of the second doped region is no greater than approximately 0.5 times a width of the first doped region.

7. The electronic device of claim 6, wherein the width of the second doped region is at least approximately 0.05 times the width of the first doped region.

8. The electronic device of claim 1, wherein the second doped region has a width no greater than approximately 0.3 micron.

9. The electronic device of claim 8, wherein the second doped region has a width of at least approximately 0.05 micron.

10. The electronic device of claim 1, wherein a peak dopant concentration of the second doped region is lower than a peak dopant concentration of the drain region.

11. The electronic device of claim 1, wherein a peak dopant concentration of the second doped region is no greater than approximately 9 times a peak dopant concentration of the first doped region.

12. The electronic device of claim 1, wherein a peak dopant concentration of the second doped region is in a range of approximately 2 to approximately 5 times a peak dopant concentration of the first doped region.

13. The electronic device of claim 1, further comprising a gate electrode and a conductive electrode, wherein:
   the gate electrode and the conductive electrode are separated by a distance; and a width of the first doped region is no greater than approximately 1.5 times the distance.

14. A process of forming an electronic device comprising:
forming a drain region of a transistor, wherein the drain region is formed along a primary surface of a semiconductor layer and has a first conductivity type;
forming a first doped region along the primary surface and having the first conductivity type;
forming a second doped region along the primary surface and having the first conductivity type; and
forming a gate electrode of the transistor after forming the second doped region, wherein a channel region of the transistor is disposed under the gate electrode and along the primary surface and has a second conductivity type opposite the first conductivity type,
wherein after forming the drain region, first doped region, second doped region, and the gate electrode:
the first doped region is disposed between the drain region and the second doped region; and
the second doped region is disposed between the first doped region and the channel region.

15. The process of claim 14, further comprising:
forming a first spacer; and
removing the first spacer,
wherein forming the second doped region is performed such that the second doped region is within the semiconductor layer at a location below where the first spacer was removed.

16. The process of claim 15, further comprising:
forming a first layer over the primary surface;
patterning the first layer to define a first layer opening;
forming a second layer over the primary surface after forming the first spacer; and
removing portions of the second layer that overlie the first layer, wherein removing portions is performed before removing the first spacer.

17. The process of claim 16, wherein forming the spacer comprises:
forming a first spacer layer over the first layer and within the first layer opening; and
anisotropically etching the first spacer layer to form the first spacer.

18. The process of claim 16, wherein:
the first layer has a composition different from the first sidewall spacer and the second layer; and
the second layer has a composition different from the first sidewall spacer.

19. The process of claim 16, further comprising:
forming a third layer over the primary surface before forming the first layer;
patterning the third layer to define a third layer opening; and
forming a second sidewall spacer before forming the first sidewall spacer.

20. The process of claim 19, wherein:
the first layer has a composition different from the first sidewall spacer, the second layer, and the third layer;
the second layer has a composition different from the first sidewall spacer, the second sidewall spacer, and the third layer;
the third layer has a composition different from the first sidewall spacer; and
the first sidewall spacer has a composition different from the second sidewall spacer.

21. The process of claim 19, wherein:
each of the first layer and the second sidewall spacer includes a nitride;
the second layer includes an organic resist material;
the third layer includes an oxide; and
the first sidewall spacer includes amorphous silicon or polycrystalline silicon.

22. The process of claim 15, wherein a width of the second doped region and a width of the first sidewall spacer at its base are substantially equal.

23. The process of claim 14, wherein:
forming the first doped region includes implanting a first dopant into the semiconductor layer; and
forming the second doped region includes implanting a second dopant into a portion of the first doped region.

24. The process of claim 23, wherein forming the second doped region is performed at a dose in a range of approximately $2\times10^{12}$ ions/cm$^2$ to approximately $2\times10^{13}$ ions/cm$^2$.

* * * * *